United States Patent
Washizu et al.

[11] Patent Number: 6,022,664
[45] Date of Patent: Feb. 8, 2000

[54] LIGHT AND HEAT SENSITIVE RECORDING MATERIAL

[75] Inventors: Shintaro Washizu; Yuuichi Fukushige; Kimi Ikeda; Toshimasa Usami, all of Fujinomiya, Japan

[73] Assignee: Fuji Photo Film Co., Ltd., Kanagawa, Japan

[21] Appl. No.: 08/972,260

[22] Filed: Nov. 18, 1997

[30] Foreign Application Priority Data

| Nov. 19, 1996 | [JP] | Japan | 8-307958 |
| Dec. 13, 1996 | [JP] | Japan | 8-333724 |
| Sep. 11, 1997 | [JP] | Japan | 9-246808 |

[51] Int. Cl.$^7$ ............................ B41M 5/28; G03C 1/72
[52] U.S. Cl. ............................ 430/138; 430/944
[58] Field of Search ............................ 430/138, 944

[56] References Cited

U.S. PATENT DOCUMENTS

| 4,865,942 | 9/1989 | Gottschalk et al. | 430/138 |
| 5,091,280 | 2/1992 | Yamaguchi et al. | 430/138 |

FOREIGN PATENT DOCUMENTS

| 52-89915 | 7/1977 | Japan. |
| 60-119552 | 6/1985 | Japan. |
| 61-123838 | 6/1986 | Japan. |
| 3-87827 | 4/1991 | Japan. |
| 3-221506 | 9/1991 | Japan. |
| 4-211252 | 8/1992 | Japan. |

*Primary Examiner*—John A. McPherson
*Attorney, Agent, or Firm*—Sughrue, Mion, Zinn, Macpeak & Seas, PLLC

[57] ABSTRACT

Disclosed is a light and heat sensitive recording material which permits recording using infrared laser light, requires no developing solution or the like, causes no unnecessary generation of waste, and is capable of forming completely dry, black-and-white monochrome or color, and clear images with high contrast. The light and heat sensitive recording material comprises a light and heat sensitive recording layer disposed on a support member, comprising the light and heat sensitive recording layer. It includes an electron donating colorless dye contained in heat-responsive microcapsules; and an electron accepting compound, a polymerizable monomer which is cured by irradiation with light, and an organic borate salt or an organic borate salt of a cationic coloring material which develops functions as a photo polymerizing initiator when irradiated with light which are arranged outside the heat responsive microcapsules.

12 Claims, No Drawings

LIGHT AND HEAT SENSITIVE RECORDING MATERIAL

BACKGROUND OF THE INVENTION

1. Field of the Invention

This invention relates to a color or black-and-white type light and heat sensitive recording material to which green laser light, red laser light, or infrared laser light is applied.

2. Description of the Related Art

Various dry-type image forming methods have been studied, in which a liquid developer and the like are not used without waste problems. Among these, a method using a photocurable composition has attracted attention. This method is characterized in that a photocurable composition contained in a recording material is cured by exposure to light to form a latent image. A component concerned with color formation or color extinction is transferred within the recording material when heated and forms a color image corresponding to the latent image. The above sensitive recording material is exposed to light passed through an original image. The exposed portion is photo-cured to form a latent image. Then the recording material is heated and the uncured portion concerned with color formation or color extinction transferred to form a visible image. A perfect dry system free of waste products can be realized with this method.

There are, specifically, many types of recording materials used in this method. These recording materials are useful in methods for recording white-and-black images and are particularly useful for a color recording material. Specific examples of recording materials include recording materials disclosed in Japanese Patent Application Laid-Open (JP-A) No. 52-89915. This recording material is produced by arranging two components of a two component-type heat sensitive and color forming recording material, such as an electron accepting compound and an electron donating colorless dye, separating on the inside and outside or on both sides of a microcapsule containing a photocurable composition. When using this recording material, however, even if the photocurable composition in the capsule is sufficiently cured, the color formation of the cured portion can be insufficiently inhibited causing slight coloration of a non-image section which tends to impair contrast.

Preferred recording materials free of non-image portion coloring are typified by a recording material disclosed in JP-A No. 61-123838 in which a layer containing a photo-polymerizable composition consisting of a vinyl monomer having an acid group and a photoinitiator, a separating layer, and a layer composed of an electron donating colorless dye are laminated. In this recording material, there is no coloring of the non-image sections because heat diffusion of the acid group of the portion hardened by the colorless dye or the photo-polymer section is negligible. However, coloring density is slightly low. A method of preparing a negative image in the same manner as the above method is disclosed, for example, in JP-A No. 60-119552. In this method, a recording material in which a photopolymerizable composition composed of a monomer or prepolymer for bleaching a coloring material and a photoinitiator is arranged so that it is isolated from a coloring material bleached by the monomer or prepolymer is used. This recording material, however, has the same drawback as that of the above recording material.

The present inventors have proposed a preferable recording material in JP-A Nos. 3-87827 and 4-211252, which overcomes the problems of the coloring of the non-image portion and low image density. The recording material disclosed in JP-A No. 3-87827 has a structure in which one component of a two component-type heat sensitive and color emissive recording material is contained in a capsule and the other component which is either used as a curable component of a photocurable composite or combined with a photocurable composite is arranged outside the capsule. The recording material disclosed in JP-A No. 4-211252 comprises forming, by application, a layer including a photocurable composite containing an electron accepting compound, a polymerizable vinyl monomer, and a photoinitiator, which are all disposed outside a microcapsule, and the microcapsule containing an electron donating colorless dye.

For color recording using these sensitive recording materials, it is possible to use a recording material formed of several sensitive layers each having sensitivity to different wave-lengths and producing different colors. As more preferable examples of multicolor recording materials, the above recording material proposed by the present inventors may be given. Such a multicolor recording material is specifically a multicolor recording medium represented by a structure in which a plurality of sensitive layers which are sensitized by light of different wave lengths and form colors of different hues is provided. The sensitive layers are structured so that two or more layers are laminated upward on a support member from the side of an exposing light source to the side of the support member so that the first sensitive layer sensitized by light of a center wave length of $\lambda 1$, an intermediate layer absorbing the light of a center wave length of $\lambda 1$, a second sensitive layer sensitized by light of a center wave length of $\lambda 2$ and emits light of a wave length different from that emitted from the first sensitive layer, ..., an intermediate layer absorbing light of a center wave length $\lambda i-1$, and a (i)th sensitive layer sensitized by light of a center wave length of $\lambda i$ and emits light of a wave length different from those emitted from the first layer to the (i−1)th sensitive layer are sequentially laminated. In this case, these wave lengths satisfy the relation: $\lambda 1 < \lambda 2 < \ldots < \lambda i$, wherein i is an integer of 2 or more.

These recording materials have various uses. However, in these uses, only UV light or short wave visible light is adopted and a compact and inexpensive infrared laser and light of the green to red range cannot be adopted.

SUMMARY OF THE INVENTION

This invention has been achieved in view of this situation and has an object of providing a light and heat sensitive recording material which permits recording using infrared laser light and laser lights of the green to red range, requires no developing solution or the like, causes no waste, and is capable of forming completely dry, black-and-white or color, and clear image with high contrast.

The present inventors found that the above object can be attained by a light and heat sensitive recording material characterized in that a light and heat sensitive recording layer is disposed on at least one of the faces of a support member, the recording material having functions in which an emulsion-dispersed composition (hereinafter designated as "photocurable composition" as the case may be) capable of being cured by irradiation with light and contained outside a capsule is cured and fixed, a mobile electron accepting compound is moved within the recording material by heating whereby an electron donating colorless dye contained in the microcapsule is allowed to emit light to form an image.

Accordingly, the light and heat sensitive recording material of the present invention comprises a light and heat sensitive recording layer disposed on a support member, wherein the light and heat sensitive recording layer includes an electron donating colorless dye contained in a heat-responsive microcapsule; a compound containing an electron accepting portion and a polymerizable vinyl monomer portion in the same molecule; and an organic borate; the compound and the organic borate being arranged outside the heat responsive microcapsule.

Also, another light and heat sensitive recording material of the present invention comprises a light and heat sensitive recording layer disposed on a support member, wherein the light and heat sensitive recording layer includes an electron donating colorless dye contained in a heat-responsive microcapsule; and an electron accepting color developer, a polymerizable vinyl monomer, and an organic borate which are arranged outside the heat responsive microcapsule.

This organic borate may be an organic borate of a cationic coloring material.

Explaining the action of the light and heat sensitive recording material of the present invention, which includes either the compound containing the electron accepting portion and the polymerizable vinyl monomer portion in the same molecule or the electron accepting color developer and the polymerizable vinyl monomer, it is considered that the organic borate type compound used as a photoinitiator reacts to applied light to produce a radical, by which the polymerizable vinyl monomer is cured to form a latent image, and the electron accepting compound reacts with the electron donating colorless dye according to the characteristics of the formed latent image to form an image having high contrast.

DESCRIPTION OF THE PREFERRED EMBODIMENTS

The present invention will now be explained in detail.

As the electron donating compound, photocurable composition containing the polymerizable monomer, and electron accepting compound of the present invention, known compounds may be optionally used in combinations thereof as long as the effects of the present invention are not impaired. As the polymerizable monomer and the electron accepting compound, one compound possessing these functions may be used. Given as typical examples of the recording material corresponding to the present invention include (1) the recording material disclosed in JP-A No. 3-87827 which comprises forming, by application, a layer including a compound containing an electron accepting portion and a polymerizable vinyl monomer portion in the same molecule and a photocurable composite containing a photoinitiator, which are all disposed outside a microcapsule, and an electron donating colorless dye contained in the microcapsule. When this recording material is exposed to light, the photocurable composition which is contained outside the microcapsule, corresponding to the portion exposed to light is polymerized and cured whereby the fixated latent image is formed. Then, when the recording material is heated, the electron accepting compound existing in the unfixed portion moves within the recording material to develop the electron donating colorless dye contained in the microcapsule. In this case, the fixed latent image portion is not developed and only the unfixed portion is developed whereby a positive color image with high contrast can be formed.

Also, using a similar method corresponding to the recording material of the present invention, a negative image can be formed. Typical examples of this method include (2) a method using the recording material disclosed in JP-A No. 4-211252, which comprises forming, by application, a layer including a photocurable composite containing an electron accepting compound, a polymerizable vinyl monomer, and a photoinitiator, which are all disposed outside a microcapsule, and an electron donating colorless dye contained in the microcapsule. In this recording material, the portion exposed to light is developed and the unexposed portion is not developed. In this way a negative image with high contrast is formed. Although this mechanism is not clear, the following reason is thought to be the cause of this phenomenon. Specifically, when the recording material is exposed to light, the vinyl monomer of the portion corresponding to the portion cured of the photocurable composition contained outside the microcapsule is polymerized. In this case, the electron accepting compound (color developer) coexisting in the exposed portion is not incorporated into the formed polymer. The interactive action between the electron accepting compound and the vinyl monomer is reduced so that the electron accepting compound remains in a mobile condition and in the condition in which it is improved in diffusion rate. On the other hand, the electron accepting compound in the unexposed portion remains trapped by the vinyl monomer which is coexisting. Therefore, only the electron accepting compound in the exposed portion is primarily moved by heating within the recording material to develop the electron donating colorless dye. On the other hand, the electron accepting material in the unexposed portion cannot transmit a capsule wall even when it is heated and hence it never acts to develop the electron donating colorless dye.

As mentioned, the recording material of the present invention, specifically, "a recording material which is characterized in that a photocurable component is cured by exposure to light to form a latent image and a component concerned with color formation or color extinction is transferred within the recording material upon heating and in response to the latent image to form a color image" can be produced using various methods. The light and heat sensitive layer used for these recording materials is not limited to the above structure and may possess various structures in accordance with ones aims. Also, the recording material of the present invention may be either a monocolor, specifically, black-and-white recording material or a multicolor recording material. The multicolor recording material may have, for example, a multilayer structure in which each layer includes a microcapsule containing an electron donating colorless dye which can emit light of a hue different to others and a photocurable composition which is sensitized by light of a wave length different to others. For example, a first layer including a microcapsule containing an electron donating colorless dye, which forms a cyan color, and a photocurable composition which is sensitized by light of a wave length of $\lambda 1$ is laminated on a support member. Next, a second layer including a microcapsule containing an electron donating colorless dye, which forms a magenta color, and a photocurable composition which is sensitized by light of a wave length of $\lambda 2$ is laminated on the first layer. Then, a third layer including a microcapsule containing an electron donating colorless dye, which forms a yellow color, and a photocurable composition which is sensitized by light of a wave length of $\lambda 3$ is laminated on the second layer. Also, a structure in which intermediate layers are each interposed between the above pair of layers further or a structure in which the intermediate layers further contain a coloring material for a filter absorbing light of a wave length ranging within the sensitive wave length region of the upper sensitive layer laminated directly on the intermediate layer may be used.

In the case of the multicolor recording material, the structure in which the color filter is contained in the intermediate layer is particularly preferable. Explaining typical example of such a structure, for example, a first layer including a microcapsule containing an electron donating colorless dye, which forms a cyan color, and a photocurable composition which is sensitized by light of a wave length of λ1 is laminated on a support member. Next, a first intermediate layer containing a compound which absorbs light of a wave length shorter than λ1 is laminated on the first layer. Then, a second layer including a microcapsule containing an electron donating colorless dye, which forms a magenta color, and a photocurable composition which is sensitized by light of a wave length of λ2 is laminated on the first intermediate layer. Further, a second intermediate layer containing a compound which absorbs light of a wave length shorter than λ2 is laminated on the second layer. Furthermore, a third layer including a microcapsule containing an electron donating colorless dye, which forms a yellow color, and a photocurable composition which is sensitized by light of a wave length of λ3 is laminated on the second intermediate layer and a protective layer is further laminated on the third layer.

As the electron accepting and polymerizable vinyl monomer used mainly for a positive-type recording material in this invention, compounds containing an electron accepting group and a vinyl group in one molecule can be used.

Typical examples of such a compound include various compounds synthesized with reference to 3-halo-4-hydroxybenzoic acid described in JP-A No. 4-226455; methacryloxyethyl benzoate having a hydroxy group which is described in JP-A No. 63-173682 and acryloxyethyl ester which can be synthesized by the same synthetic method; esters of benzoic acid containing a hydroxy group and hydroxymethylstyrene which is described in JP-A Nos. 59-83693, 60-141587, and 62-99190; hydroxystyrene described the specification of EPC No. 29323; N-vinylimidazole complexes of zinc halide described in JP-A Nos. 62-167077 and 62-16708; monomers for color developers described in JP-A No. 63-317558 ; and the like.

As specific examples of the compounds containing an electron accepting portion and a polymerizable vinyl monomer portion in the same molecule, 3-halo-4-hydroxybenzoic acids represented by the following general formula are preferably used:

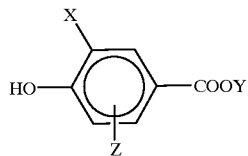

wherein X represents a halogen atom in which a chlorine atom is preferable; Y represents a monovalent group having a polymerizable ethylene group, in which an aralkyl group, an acryloyloxyalkyl group, or a methacryloyloxyalkyl group, which have a vinyl group, is preferable and an acryloyloxyalkyl group having 5–11 carbon atoms, or a methacryloyloxyalkyl group having 6–12 carbon atoms is particularly preferable; and Z represents a hydrogen atom, an alkyl group, or an alkoxyl group.

Specific examples of 3-halo-4-hydroxybenzoic acids include 3-chloro-4-hydroxyvinylphenethyl benzoate, 3-chloro-4-hydroxy vinylphenylpropyl benzoate, 3-chloro-4-hydroxy-(2-acryloyloxyethyl)benzoate, 3-chloro-4-hydroxy-(2-methacryloyloxyethyl)benzoate, 3-chloro-4-hydroxy-(2-acryloyloxypropyl)benzoate, 3-chloro-4-hydroxy-(2-methacryloyloxypropyl)benzoate, 3-chloro-4-hydroxy-(3-acryloyloxypropyl)benzoate, 3-chloro-4-hydroxy-(3-methacryloyloxypropyl)benzoate, 3-chloro-4-hydroxy-(4-acryloyloxybutyl)benzoate, 3-chloro-4-hydroxy-(4-methacryloyloxybutyl)benzoate, 3-chloro-4-hydroxy-(5-acryloyloxypentyl)benzoate, 3-chloro-4-hydroxy-(5-methacryloyloxypentyl)benzoate, 3-chloro-4-hydroxy-(6-acryloyloxyhexyl)benzoate, 3-chloro-4-hydroxy-(6-methacryloyloxyhexyl)benzoate, 3-chloro-4-hydroxy-(8-acryloyloxyoctyl)benzoate, 3-chloro-4-hydroxy-(8-methacryloyloxyoctyl)benzoate, and the like.

Given as preferable examples of the above compound containing the electron accepting portion and the polymerizable vinyl monomer portion in the same molecule are styrenesulfonylaminosalicylic acid, vinylbenzyloxyphthalic acid, zinc β-methacryloxyethoxy salicylate, zinc β-acryloxyethoxy salicylate, vinyloxyethyloxybenzoic acid, β-methacryloxyethyl orsellinate, β-acryloxyethyl orsellinate, β-methacryloxyethoxyphenol, β-acryloxyethoxyphenol, β-methacryloxyethyl-β-resorcinate, β-acryloxyethyl-β-resorcinate, hydroxystyrene-N-ethylamide sulfonate, β-methacryloxypropyl-p-hydroxy benzoate, β-acryloxypropyl-p-hydroxy benzoate, methacryloxymethylphenol, acryloxymethylphenol, methacrylamidepropanesulfonic acid, acrylamidepropanesulfonic acid, β-methacryloxyethoxy-dihydroxybenzene, β-acryloxyethoxy-dihydroxybenzene, γ-styrenesulfonyloxy-β-methacryloxypropanecarboxylic acid, γ-acryloxypropyl-α-hyd00roxyethyloxysalicylic acid, β-hydroxyethoxylphenol, β-methacryloxyethyl-p-hydroxy cinnamate, β-acryloxyethyl-p-hydroxy cinnamate, 3,5-distyreneamidophenol sulfonate, methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, 3-β-hydroxyethoxyphenol, β-methacryloxyethyl-p-hydroxy benzoate, β-acryloxyethyl-p-hydroxy benzoate, β'-methacryloxyethyl-β-resorcinate, β-methacryloxyethyloxycarbonylhydroxybenzoic acid, β-acryloxyethyloxycarbonylhydroxybenzoic acid, N,N'-di-β-methacryloxyethylaminosalicylic acid, N,N'-di-β-acryloxyethylaminosalicylic acid, N,N'-di-β-methacryloxyethylaminosulfonylsalicylic acid, N,N'-di-β-acryloxyethylaminosulfonylsalicylic acid, metal salts thereof (for example, a zinc salt and the like), and the like.

Preferred examples of materials used as the photoinitiator for the recording material of the present invention include organic borate compounds or organic borates of a cationic coloring material which can initiate the photopolymerization of the above vinyl monomer and which are considered to have sensitivity to light in the green to red range, and/to the infrared range and which can generate radicals upon irradiation when used in combination with coloring materials sensitive to the above wave length-range (see JP-A No. 62-143044).

In the recording material of the present invention, in which the recording layer includes the organic borate-type compound, this organic borate is irradiated with laser light to generate a radical which initiates the polymerization of the polymerizable monomer contained in the composition to be cured by irradiation with light and the produced polymer forms a latent image.

Next, the organic borate used in the recording material of the present invention will be explained. The compound used in the recording material of the present invention is an organic borate-type compound and preferably an organic borate salt represented by the general formula (I) illustrated below. This compound is preferably used in combination with a spectral sensitization coloring material.

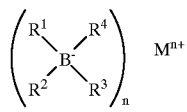
(I)

wherein M represents an alkali metal, quaternary ammonium, pyridinium, quinolinium, diazonium, morpholinium, tetrazolium, acridinium, phosphonium, sulfonium, oxosulfonium, sulfur, oxygen, carbon, halogenium, Cu, Ag, Hg, Pd, Fe, Co, Sn, Mo, Cr, Ni, As, Se; n denotes an integer of from 1 to 6; and $R^1$, $R^2$, $R^3$, and $R^4$, which may be the same or different, respectively, represent a group selected from a group consisting of a halogen atom, a substituted or unsubstituted alkyl group, a substituted or unsubstituted aryl group, a substituted or unsubstituted aralkyl group, a substituted or unsubstituted alkaryl group, a substituted or unsubstituted alkenyl group, a substituted or unsubstituted alkynyl group, a substituted or unsubstituted alicyclic group, a substituted or unsubstituted heterocyclic group, a substituted or unsubstituted allyl group, and a substituted or unsubstituted silyl group, wherein two or more of $R^1$, $R^2$, $R^3$, and $R^4$ may be combined to form a cyclic structure.

Preferred examples of an anionic borate include tetramethyl borate, tetraethyl borate, tetrabutyl borate, triisobutylmethyl borate, di-n-butyl-di-t-butyl borate, tetra-n-butyl borate, tetraphenyl borate, tetra-p-chlorophenyl borate, tetra-m-chlorophenyl borate, tri-m-chlorophenyl-n-hexylborate, triphenylmethyl borate, triphenylethyl borate, triphenylpropyl borate, triphenyl-n-butyl borate, trimesitylbutyl borate, tritolylisopropyl borate, triphenylbenzyl borate, tetraphenyl borate, tetrabenzyl borate, triphenylphenetyl borate, triphenyl-p-chlorobenzyl borate, triphenylethenylbutyl borate, di(α-naphthyl)-dipropyl borate, triphenylsilyltriphenyl borate, tritoluilsilyltriphenyl borate, tri-n-butyl(dimethylphenylsilyl)borate, and the like.

Specific examples of the organic borate represented by the above formula (I) are given in, but not limited to, the following:

I-(1)
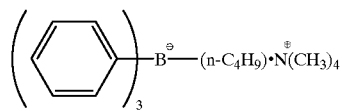

I-(1-i)
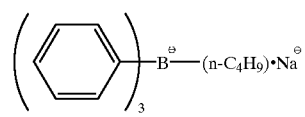

I-(1-ii)
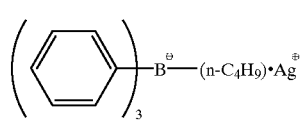

I-(1-iii)
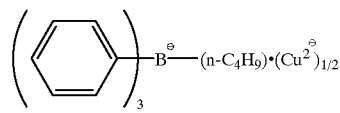

I-(2)
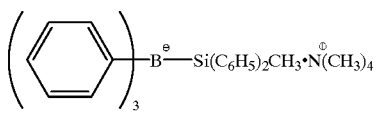

I-(3)
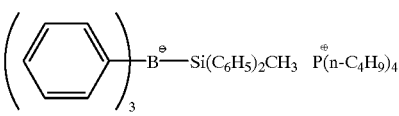

I-(4)
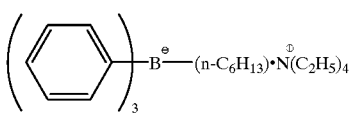

I-(5)
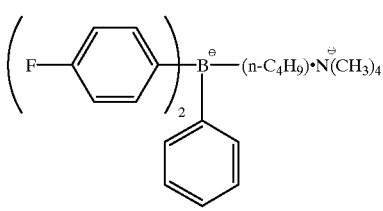

I-(6)
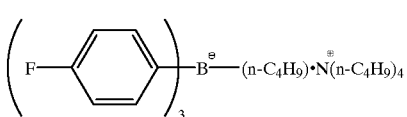

I-(6-i)
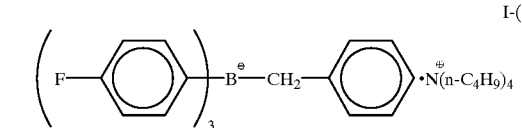

I-(6-ii)
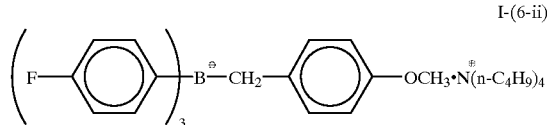

I-(6-iii)
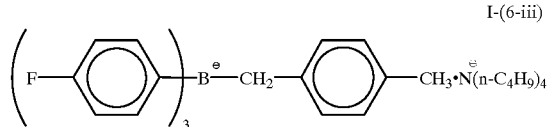

I-(6-iv)
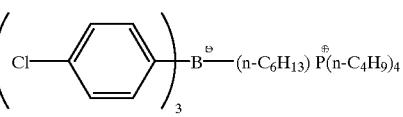

I-(7)
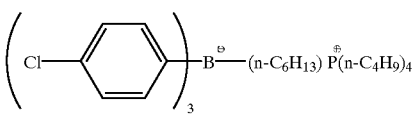

I-(8) 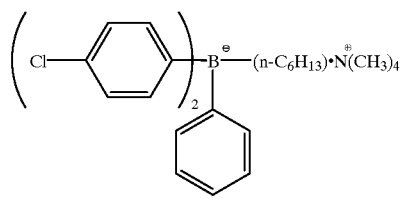

I-(9) 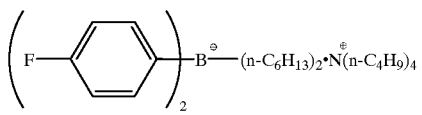

I-(10) 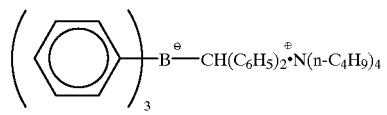

I-(11) 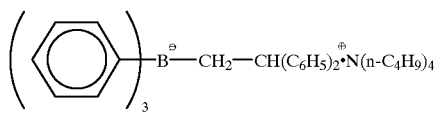

I-(12) 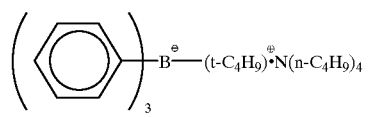

I-(13) 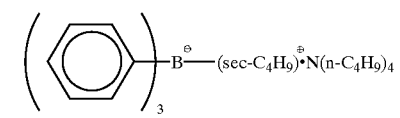

I-(14) 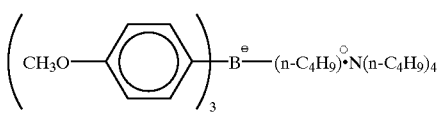

I-(15) 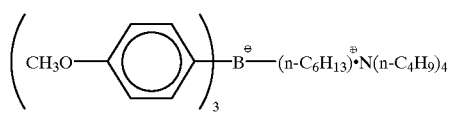

I-(16) 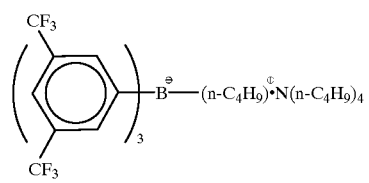

I-(17) 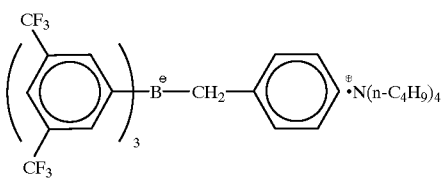

I-(18) 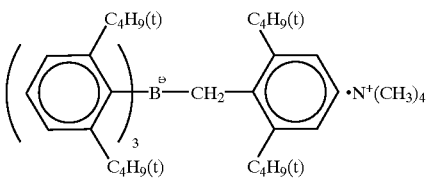

I-(19) 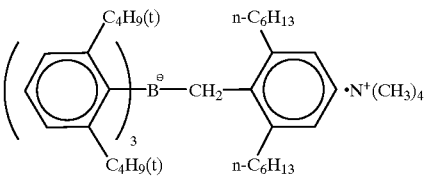

In the present invention, it is preferable that the organic borate salt be used in combination with a coloring material which absorbs light of the green to red region and of the infrared region to improve the efficiency of absorbing laser light.

Also, in the present invention, as examples of the infrared-absorbing coloring material which is used in combination with the above organic borate salt as required and demonstrates maximum absorption with wave lengths ranging from 500 to 1100 nm, cationic coloring materials are given. Among these, a cationic dye selected from a group consisting of a methine coloring material, polymethine coloring material, triarylmethane coloring material, indoline coloring material, azine coloring material, xanthene coloring material, oxazine coloring material, and acridine coloring material is preferable.

Also, preferred examples of the cationic coloring material are a cationic dye selected from a group consisting of cyanine coloring material, hemicyanine coloring material, rhodamine coloring material, and azamethine coloring material.

Any organic cationic coloring material, which possesses an absorption peak in a wave length range of 500 nm or more and preferably of from 500 to 1100 nm can be used as the cationic coloring material (a spectral sensitization coloring material) used in the present invention.

Given as specific examples of the organically cationic coloring material are cationic methine coloring materials, cationic carbonium coloring materials, cationic quinoneimine coloring materials, cationic indoline coloring materials, and cationic styryl coloring materials. Examples of the cationic methine coloring materials are preferably a polymethine coloring material, cyanine coloring material, and azomethine coloring material, and more preferably cyanine, carbocyanine, dicarbocyanine, tricarbocyanine, hemicyanine, and the like. Examples of the cationic carbonium coloring material are preferably a triarylmethane coloring material, xanthene coloring material, and acridine coloring material, and more preferably a rhodamine and the like. Preferred examples of the cationic quinoneimine coloring material are coloring materials selected from azine coloring materials, oxazine coloring materials, thiazine coloring materials, quinoline coloring materials, thiazole coloring materials, and the like. These coloring materials may be used either singly or in combinations of two or more.

There are many known organic cationic coloring compounds having an absorption peak in the 500 nm wave length or above. For example, the coloring materials described in "Chemistry of Functional Coloring Materials" p393–416, (1981), published by CMC, "Coloring Materials" Vol. 60 [4] p212–224 (1987), and the like.

Next, other organic borate salts of cationic coloring materials preferably used as the photo polymerization initiator of the recording material of the present invention will be explained. The organic borate salts of the cationic coloring materials concerning the present invention are preferably the compounds represented by the general formula (II) described below.

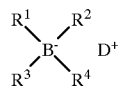

II wherein $D^+$ represents a cationic coloring material; and $R^1$, $R^2$, $R^3$, and $R^4$, which may be the same or different, respectively represent a group selected from a group consisting of a halogen atom, a substituted or unsubstituted alkyl group, a substituted or unsubstituted aryl group, a substituted or unsubstituted aralkyl group, a substituted or unsubstituted alkaryl group, a substituted or unsubstituted alkenyl group, a substituted or unsubstituted alkynyl group, a substituted or unsubstituted alicyclic group, a substituted or unsubstituted heterocyclic group, a substituted or unsubstituted allyl group, and a substituted or unsubstituted silyl group, wherein two or more of $R^1$, $R^2$, $R^3$, and $R^4$ may be combined to form a cyclic structure.

The cationic coloring material represented by $D^+$ is a cationic dye preferably selected from the group consisting of a methine coloring material, a polymethine coloring material, a triarylmethane coloring material, an indoline coloring material, an azine coloring material, a xanthene coloring material, an oxazine coloring material, and an acridine coloring material.

Also, preferred examples of the cationic coloring material are a cationic dye selected from the group consisting of a cyanine coloring material, a hemicyanine coloring material, a rhodamine coloring material, and an azamethine coloring material.

The organic borate of an organic cationic coloring material represented by the above general formula (II) can be produced by the method described in EPC No. 223,587 A-1 using an organic cationic coloring material and an organic boron compound anion.

Any organic cationic coloring material, which possesses an absorption peak in the wave length range of 500 nm or more and preferably of from 550 to 1100 nm can be desirably used as the cationic coloring material (spectral sensitization coloring material) represented by $D^+$ in the above general formula (II) in the present invention.

Given as specific examples of the organic cationic coloring material which can be used in the present invention are cationic methine coloring materials, cationic carbonium coloring materials, cationic quinoneimine coloring materials, cationic indoline coloring materials, and cationic styryl coloring materials. Examples of the cationic methine coloring materials are preferably a polymethine coloring material, a cyanine coloring material, and an azomethine coloring material, and more preferably cyanine, carbocyanine, dicarbocyanine, tricarbocyanine, hemicyanine, and the like. Examples of the cationic carbonium coloring material are preferably a triarylmethane coloring material, a xanthene coloring material, and an acridine coloring material, and more preferably a rhodamine and the like. Preferred examples of the cationic quinoneimine coloring material are coloring materials selected from azine coloring materials, oxazine coloring materials, thiazine coloring materials, quinoline coloring materials, thiazole coloring materials, and the like. These coloring materials may be used either singly or in combinations of two or more.

There are many compounds known as the organic cationic coloring material having an absorption peak in the wave lengths of 500 wavelength region or above. For example, the coloring materials described in "Chemistry of Functional Coloring Materials" p393–416, (1981), published by CMC, "Coloring Materials" Vol. 60 [4] p212–224 (1987), and the like.

Specific examples of anion salts of the organic boron compound (organic borate) of the organic cationic coloring material represented by the above formula (II) are given in the following. The effects of the recording material of the present invention are not limited to the following compounds.

II-(1)

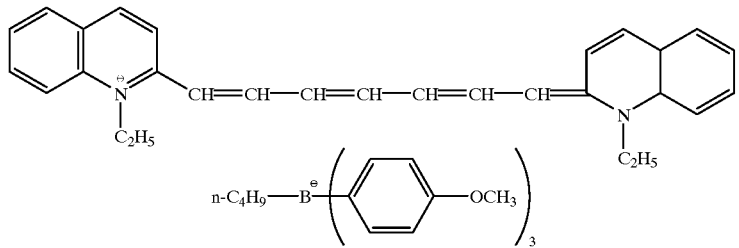

II-(2)
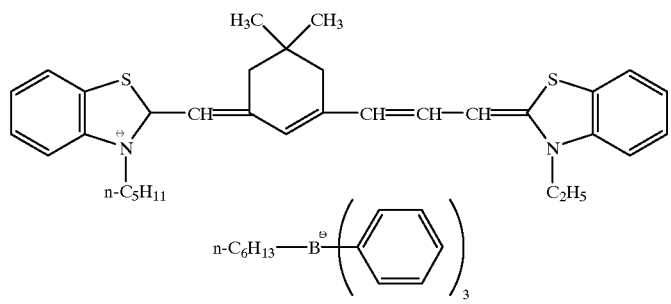
II-(3)
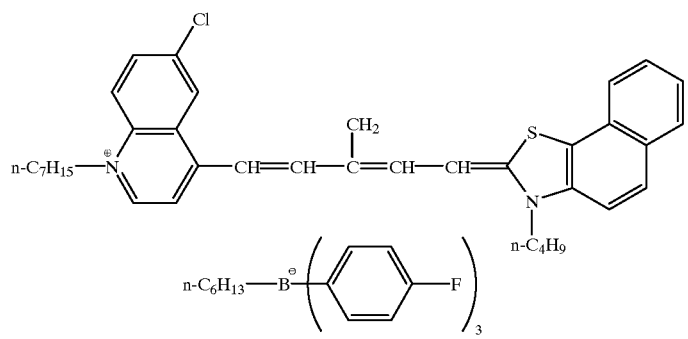
II-(4)
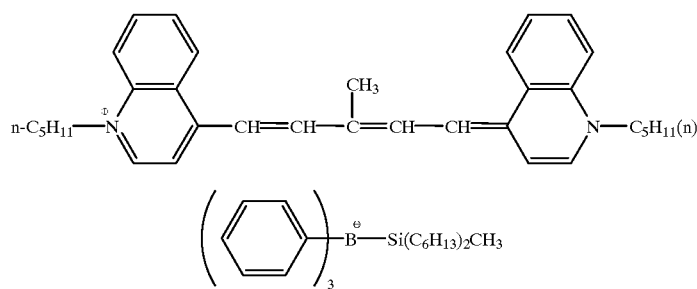
II-(5)
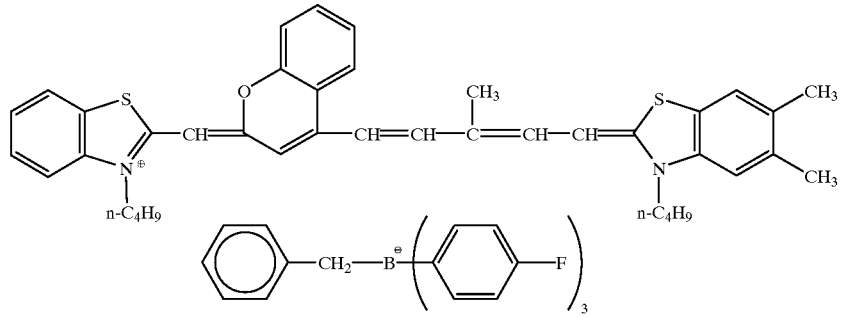
II-(6)
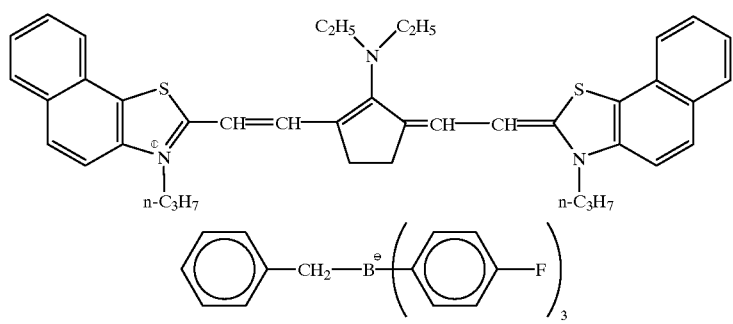

-continued
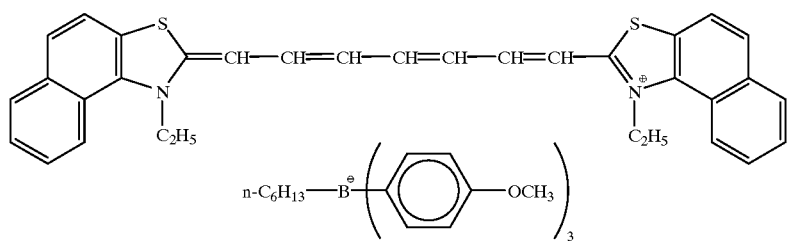
II-(7)
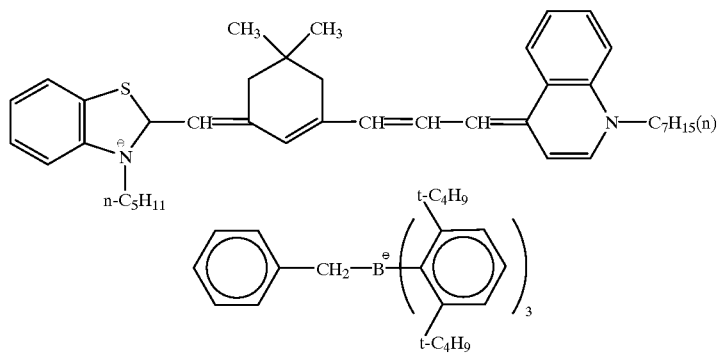
II-(8)
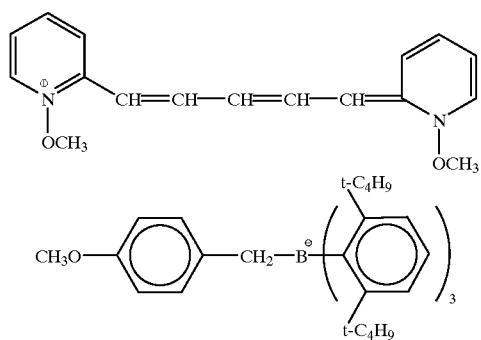
II-(9)
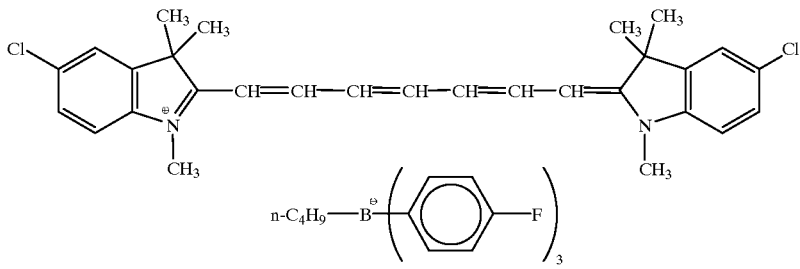
II-(10)
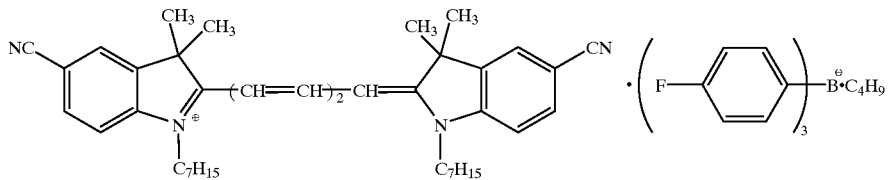
II-(11)
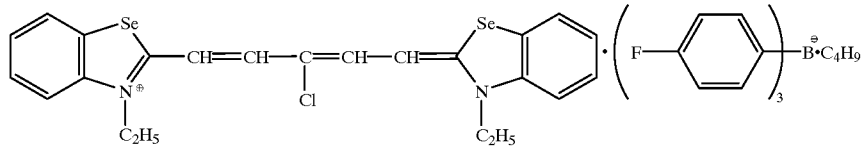
II-(12)

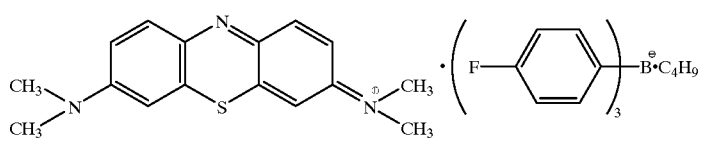
II-(13)
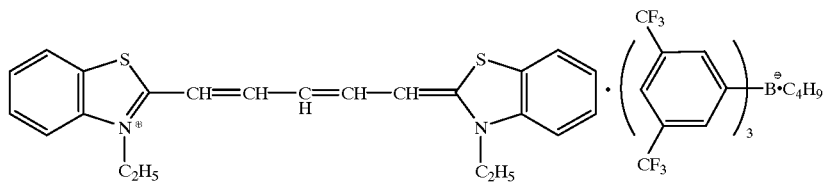
II-(14)
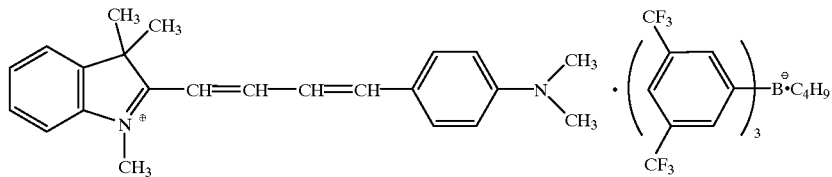
II-(15)
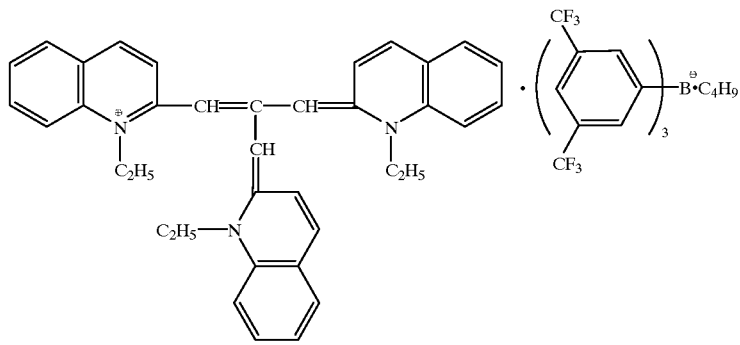
II-(16)
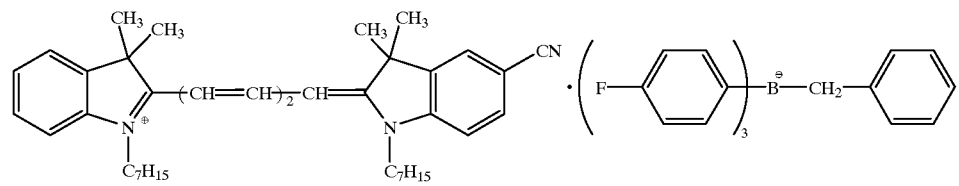
II-(17)
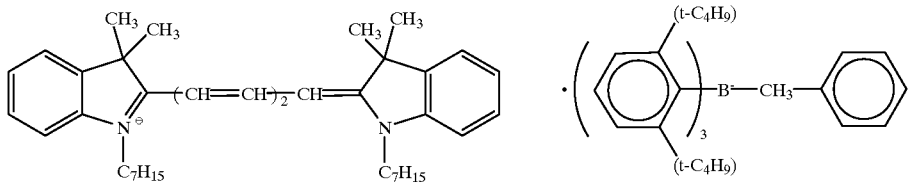
II-(18)
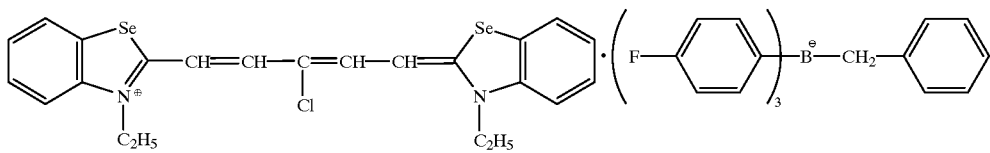
II-(19)

-continued

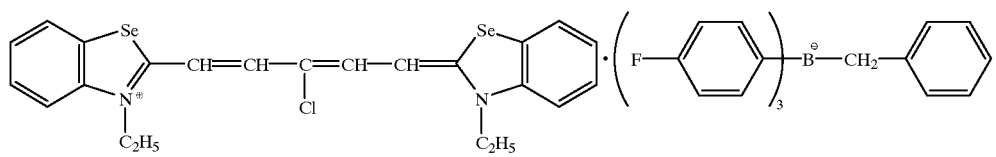
II-(20)

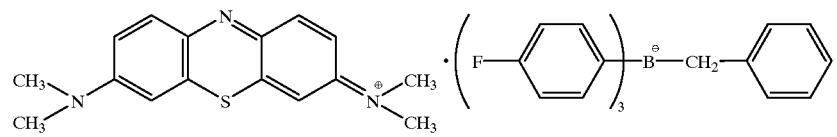
II-(21)

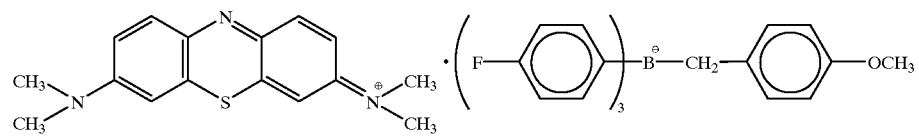
II-(22)

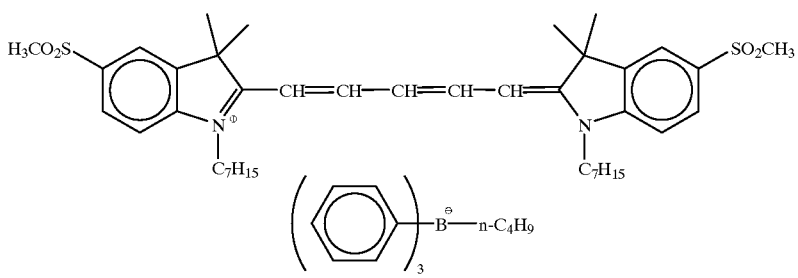
II-(23)

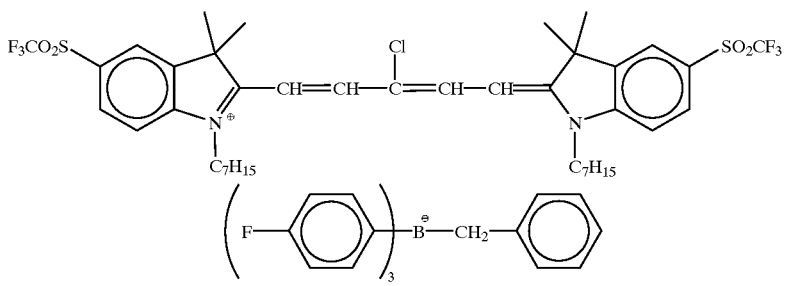
II-(24)

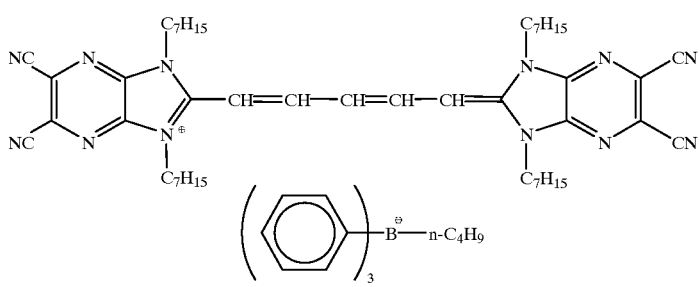
II-(25)

The content of the photo polymerization initiator based on the total amount of the photocurable composition is preferably from 0.01 to 20% by weight, more preferably from 0.2 to 15% by weight, and most preferably from 1 to 10% by weight. If the content is not more than 0.01% by weight, the sensitivity is insufficient, whereas if the content exceeds 10% by weight, an increase in sensitivity is not expected.

In the present invention, aids such as compounds represented by the following formulae (III) and (IV), which have an intramolecular active halogen group, may be used as required together with a spectrum sensitization coloring material and the above organic borate salt.

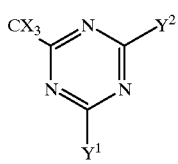

III wherein X represents a halogen atom; $Y^1$ represents —$CX_3$, —$NH_2$, —NHR, —$NR_2$, or —OR, wherein R represents an alkyl group, a substituted alkyl group, an aryl group, or a substituted aryl group; and $y^2$ represents —$CX_3$, an alkyl group, a substituted alkyl group, an aryl group, a substituted aryl group, or a substituted alkenyl group, wherein the substituted group may be the actual compound represented by the general formula (III).

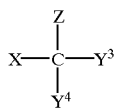

IV wherein X represents a halogen atom; $Y^3$ and $y^4$, which may be the same or different, respectively represent a hydrogen atom or halogen atom; and Z represents the group shown by the following formulae.

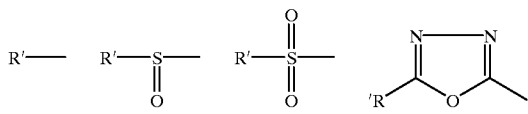

wherein R' represents a hydrogen atom, a halogen atom, an alkyl group, a substituted alkyl group, an aryl group, a substituted aryl group, a substituted alkenyl group, a heterocyclic group, or a substituted heterocyclic group.

Given as examples of the compound represented by the above general formula (III) are the compounds described by Wakabayashietal, "Bull, Chem, Soc, Japan", Vol.42, p.2924, (1969), specifically, 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine, 2-(α,α,β-trichloroethyl)-4,6-bis(trichloromethyl)-S-triazine, and the like; the compounds described in BP (British Patent) No. 1388492, such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine, 2-(p-methoxystyryl)-4-amino-6-trichloromethyl-S-triazine, and the like; the compounds described in JP-A No. 53-133428, such as 2-(4-methoxy-naphtho-1-yl)-4,6-bis-trichloromethyl-S-triazine, 2-(4-ethoxy-naphtho-1-yl)-4,6-bis-trichloromethyl-S-triazine, 2-[4-(2-ethoxyethyl)-naphtho-1-yl]-4,6-bis-trichloromethyl-S-triazine, 2-(4,7-dimethoxy-naphtho-1-yl)-4,6-bis-trichloromethyl-S-triazine, 2-(acenaphtho-5-yl)-4,6-bis-trichloromethyl-S-triazine, and the like; and the compounds described in German Patent No. 3337024, such as those represented by the following formulae:

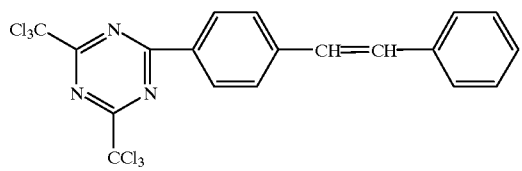

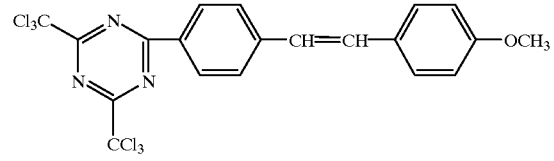

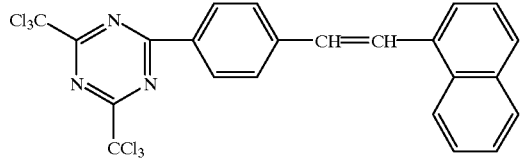

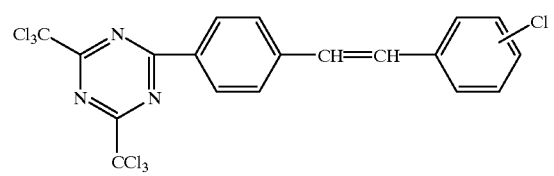

Other than the above, the compounds represented by the following formulae can be used as the aids.

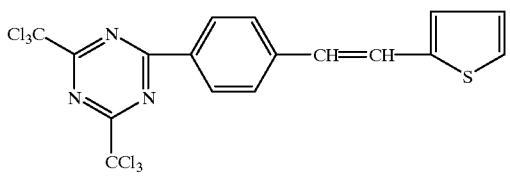

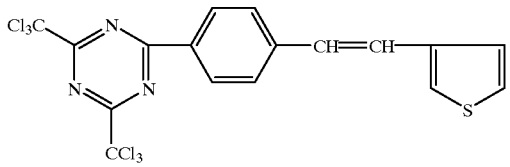

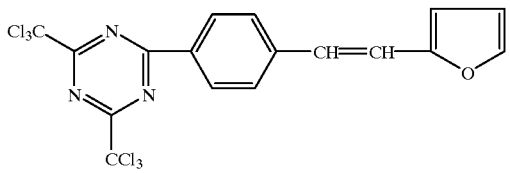

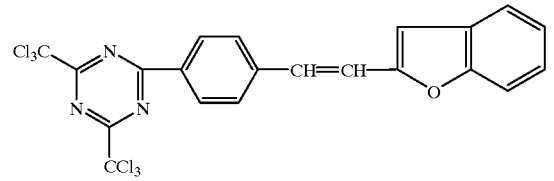

Also, examples of the compound represented by the above formula (III) include the compounds described by F.C. Schaefer et al, J. Org. Chem. 29, 1527, (1964), such as 2-methyl-4,6-bis(tribromomethyl)-S-triazine, 2,4,6-tris(tribromomethyl)-S-triazine, 2,4,6-tris(dibromomethyl)-S- triazine, 2-amino-4-methyl-6-tribromomethyl-S-triazine, 2-methoxy-4-methyl-6-trichloromethyl-S-triazine, and the like.

Further, the compounds described in Japanese Patent Application No. 60-198868, such as the compounds represented by the following formulae are exemplified.

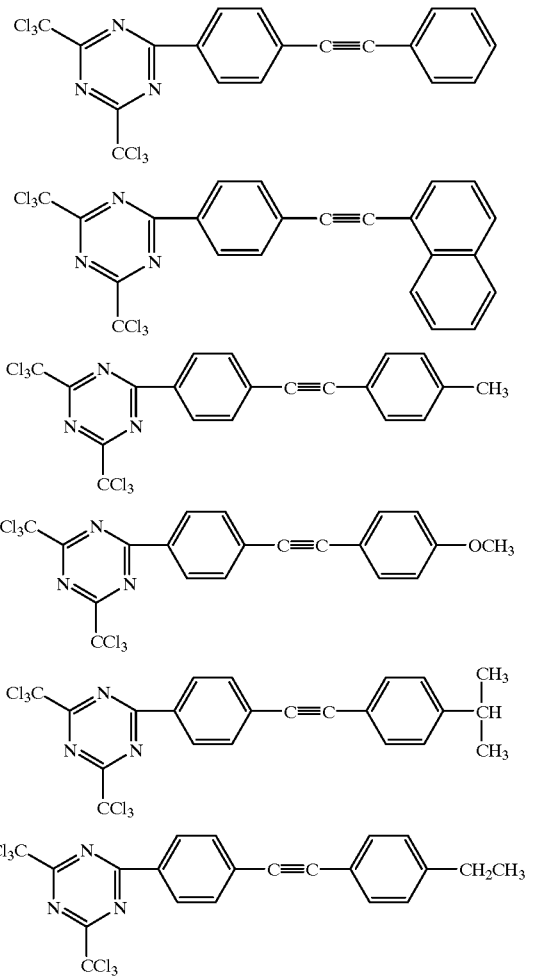

When the compound represented by the above general formula (III) is used as the aid for the recording material of the present invention, it is particularly desirable to use compounds in which $Y^1$ is —$CX_3$.

The compound represented by the above general formula (III), which is used in the present invention, can be synthesized through methods known to persons skilled in the art. Specifically, for example, the compound having the structure described below can be produced using the method illustrated in Bull. Chem. Soc. Jpn., 42, 2924, (1969).

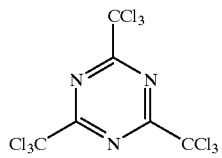

Also, the compound having the structure described below can be produced using the method illustrated in DE No. 2718259 (Application No.) as a reference.

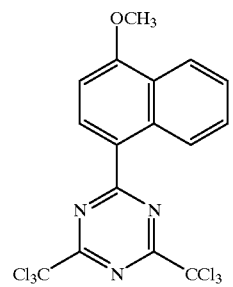

Also, the compound having the structure described below can be produced using the method illustrated in U.S. Pat. No. 4,619,998 as a reference.

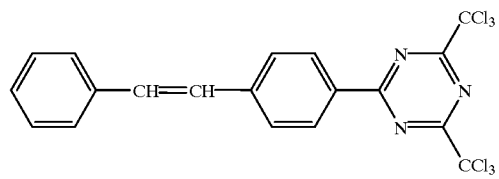

Examples of the compounds having an active halogen group and represented by the above general formula (4), which are used as an aid for the spectrum sensitization coloring material, include the compounds described in Japanese Patent Application Publication (JP-B) No. 51-8330, specifically, such as carbon tetrachloride, carbontetrabromide, iodoform, p-nitro-α,α,α-tribromoacetophenone,ω,ω,ω-tribromoquinaldine, tribromomethylphenylsulfone, trichloromethylphenylsulfone, and the like. Also, the compounds having the structure represented by the following formula, which are described in Japanese Patent Application Publication (JP-B) No. 49-12180 can be used.

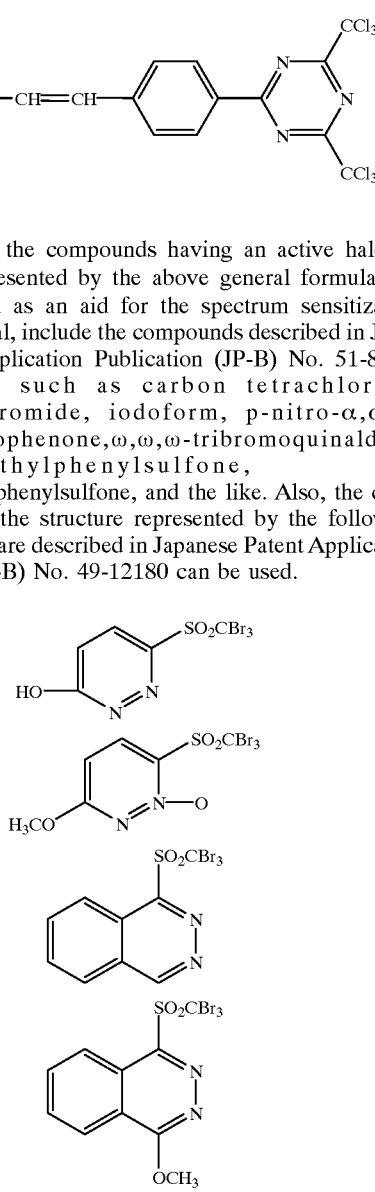

In addition, the compounds having the structures represented by the following formulae, which are described in JP-A No. 60-138539 can be used.

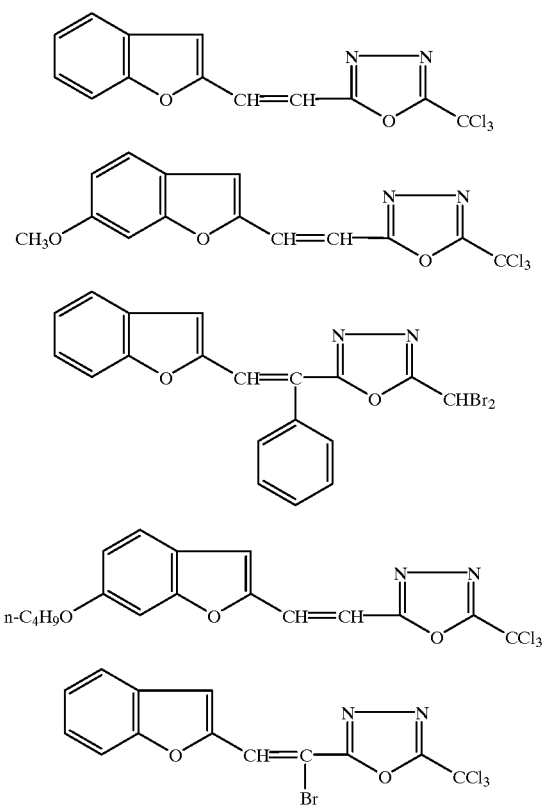

Examples of compounds used as the compound having an active halogen group, which is preferably used in the present invention, are given in, but not limited to, the following:

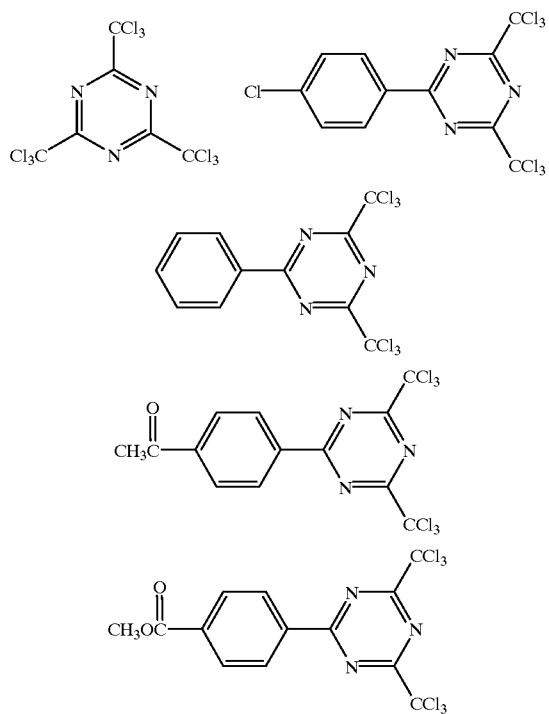

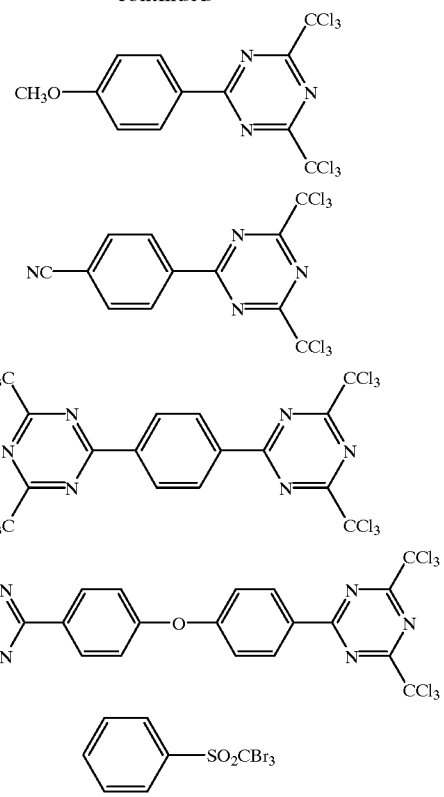

It is desirable that the compound shown by the general formula (III) or (IV) be added in an amount of from 0.01 to 20 mols and preferably from 0.1 to 10 mols per mol of the spectrum sensitization coloring material.

The recording material of the present invention is highly sensitive and also sensitive to infrared light. A reducing agent, for example, an oxygen scavenger, a chain transfer agent for an active hydrogen donor, and other compounds can be further used as an aid for promoting the formation of a latent image.

Examples of the oxygen scavenger which have been found useful as the aid for promoting the formation of a latent image include phosphine, phosphonate, phosphite, stannous salt, and other compounds which are easily oxidized by oxygen. Specific examples of the oxygen scavenger are N-phenylglycine, trimethylbarbituric acid, N,N-dimethyl-2,6-diisopropylaniline, N,N,N-2,4,6-pentamethylaniline, and the like. Also, thiols, thioketones, lophine dimer compounds, iodonium salts, sulfonium salts, azinium salts, organic peroxides, and the like are useful as aids.

The following compounds are given as examples of the thiols:

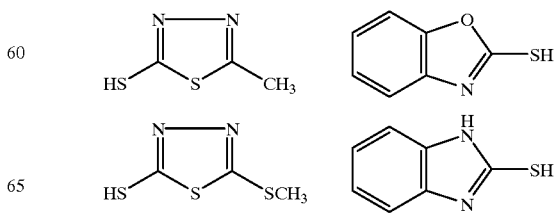

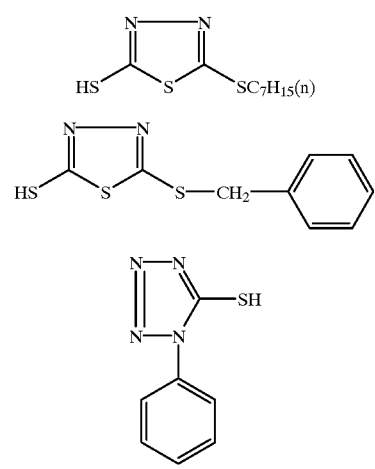
The following compounds are given as examples of the thioketones:
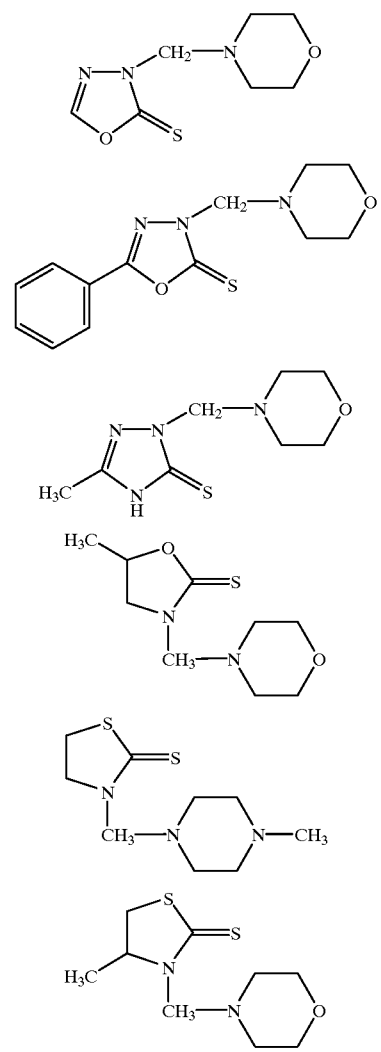
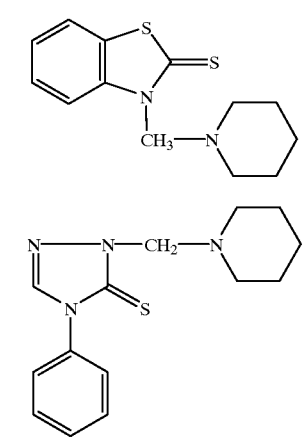
The following compounds are given as examples of the lophine dimer compounds:
The following compounds are given as examples of the iodonium salts:
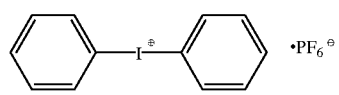
The following compounds are given as examples of the sulfonium salts:

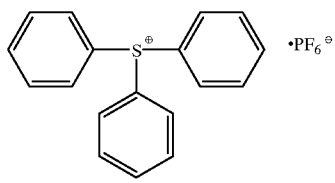

The following compounds are given as examples of the azinium salts:

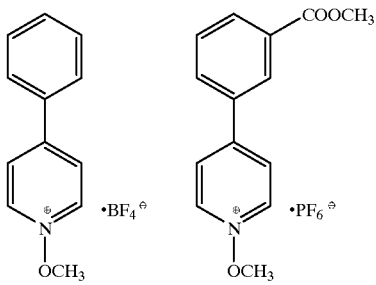

The following compounds are given as examples of the organic peroxides:

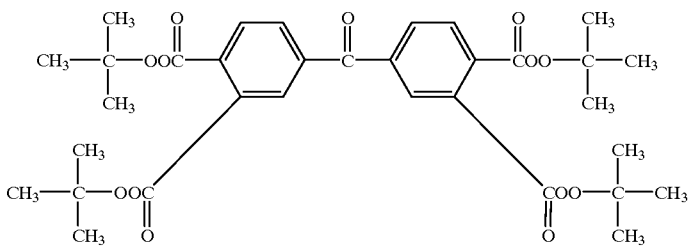

Also, it is preferable to use an electron accepting compound in the a photocurable composition of the negative recording material used in the present invention. This electron accepting compound may be added to the photocurable composition of a positive recording material according to requirements in order to improve the coloring density. Given as examples of the electron accepting compound are phenol derivatives, salicylic acid derivatives, metal salts of aromatic carboxylic acid, acid clay, bentonite, novolak resins, metal-treated novolak resins, metal complexes, and the like. These examples are illustrated by described in (JP-B) Nos. 40-9309 and 45-14039, (JP-A) Nos. 52-140483, 48-51510, 57-210886, 58-87089, 59-11286, 060-176795, and 61-95988, and the like. A part of these compounds are illustrated by 2,2'-bis(4-hydroxyphenyl)propane, 4-t-butylphenol, 4-phenylphenol, 4-hydroxydiphenoxide, 1,1'-bis(3-chloro-4-hydroxyphenyl)cyclohexane, 1,1'-bis(4-hydroxyphenyl)cyclohexane, 1,1'-bis(3-chloro-4-hydroxyphenyl)-2-ethylbutane, 4,4'-sec-isooctylidenediphenol, 4,4'-sec-butylidenediphenol, 4-tert-octylphenol, 4-p-methylphenylphenol, 4,4,'-methylcyclohexylidenephenol, 4,4'-isopentylidenephenol, p-hydroxybenzyl benzoate, and the like as a phenol type compounds; 4-pentadecylsalicylic acid, 3,5-di($\alpha$-methylbenzyl)salicylic acid, 3,5-di(tert-octyl)salicylic acid, 5-octadecylsalicylic acid, 5-$\alpha$-(p-$\alpha$-methylbenzylphenyl) ethylsalicylic acid, 3-$\alpha$-methylbenzyl-5-tert-octylsalicylic acid, 5-tetradecylsalicylic acid, 4-hexyloxysalicylic acid, 4-cyclohexyloxysalicylic acid, 4-decyloxysalicylic acid, 4-dodecyloxysalicylic acid, 4-pentadecyloxysalicylic acid, 4-octadecyloxysalicylic acid, and the like as salicylic acid derivatives; and zinc, aluminum, calcium, copper, or lead salts thereof. When these electron accepting compounds are blended, it is desirable that each of these be used at a level of from 5 to 1,000% by weight of the amount of the electron donating colorless dye.

A monomer having at least one vinyl group in a molecule can be used in a photocurable composition for a negative recording material used in the present invention. Examples of the monomer include acrylic acid and its salt, acrylates, acrylamides; methacrylic acid and its salt, methacrylates, methacrylamides; maleic acid anhydride, maleates; itaconic acid, itaconates; styrenes; vinyl ethers; vinylesters; N-vinyl heterocyclic compounds; aryl ethers; arylesters; and the like. Among these, monomers having a plurality of vinyl groups in a molecule are preferred. Typical examples of these monomers may include acrylates or methacrylates of a polyvalent alcohol such as trimethylol propane, pentaerythritol, and the like; acrylates or methacrylates of polyvalent phenol or bisphenol such as resorcinol, pyrogallol, phloroglucinol, and the like; acrylates or methacrylates terminal epoxy resins, acrylates or methacrylates terminal polyesters, and the like. Particularly preferable examples of these compounds are ethylene glycol diacrylate, ethylene glycol dimethacrylate, trimethylolpropane triacrylate, pentaerythritol tetraacrylate, dipentaerythritolhydroxy pentaacrylate, hexanediol-1,6-dimethacrylate, diethylene glycol dimethacrylate, and the like. The molecular weight of the multifunctional monomer is preferably from about 100 to 5000 and more preferably from about 300 to 2000.

In addition to the above compounds, for example, photocurable compositions having a polyvinyl cinnamate, polyvinylcinnamilidene acetate, or an $\alpha$-phenylmaleimide group may be added as an optically cross-linking composition. These optically cross-linking compositions may be used as a photocurable component.

In addition to these compounds, a heat polymerization inhibitor may be added to the photocurable composition as required. The heat polymerization inhibitor is added to avoid the polymerization of the photocurable composition caused by heat or the passage of time and thereby to improve the chemical stability when the photocurable composition is prepared or stored. Examples of the heat polymerization inhibitor may include p-methoxyphenol, hydroquinone, t-butylcatechol, pyrogallol, 2-hydroxybenzophenone, 4-methoxy-2-hydroxybenzophenone, cuprous chloride, phenothiazine, chloranil, naphthylamine, $\beta$-naphthol, 2,6-di-t-butyl-p-cresol, nitrobenzene, dinitrobenzene, picric acid, p-toluidine, and the like. The amount of the heat polymerization inhibitor is preferably from 0.001 to 5% by weight and more preferably from 0.01 to 1% by weight based on the total amount of the photocurable composition. If the amount is not more than 0.001% by weight, the heat stability is poor, whereas if the amount exceeds 5% by weight, the sensitivity is deteriorated.

The photocurable composition for the recording material of the present invention is emulsion-dispersed and contained in a light and heat sensitive layer. At this time, natural oil and synthetic oil may be used as the solvent which dissolves each material contained in the photocurable composition. Examples of materials used as the solvent may include cotton seed oil, kerosene, aliphatic ketone, aliphatic ester, paraffin, naphthenic oil, alkylated biphenyl, alkylated terphenyl, chlorinated paraffin, alkylated naphthalene, diarylethane such as 1-phenyl-1-xylylethane, 1-phenyl-1-p-ethylphenylethane, and 1,1'-ditolylethane, alkyl phthalate (dibutyl phthalate, dioctyl phthalate, dicyclohexyl phthalate, and the like), phosphate (diphenyl phosphate, triphenyl phosphate, tricresyl phosphate, dioctylbutyl phosphate, and the like), citrate (for example, tributylacetyl citrate), benzoate (for example, octyl benzoate), alkylamide (for example, diethyllaurylamide), trimesicate (for example, tributyl trimesicate), acetate (ethyl acetate, propyl acetate, iso-propyl acetate, butyl acetate, tert-butyl acetate, s-butyl acetate, and the like), propionate (for example, propionate), butyrate (isobutyrate) (for example, methyl butyrate), acrylate (methacrylate) (for example, methyl acrylate), alkyl halide (methylene chloride, carbon tetrachloride, and the like), tertiary butyl alcohol, methyl isobutyl ketone, β-ethoxyethyl acetate, methyl cellosolve acetate, cyclohexanone, and the like. Among these, aliphatic esters and alkyl halides are preferable and those having a solubility in water of 10% by volume or less are particularly preferable. Each of these solvents is preferably used in an amount of from 1 to 500 parts by weight of the amount of the polymerizable electron accepting compound.

As a water soluble high polymer, which can be used to emulsion-disperse the photocurable composition of the present invention, compounds which are dissolved in water at 25° C. at an amount of 5% by weight or more are preferable. Specific examples of these compounds may include proteins such as gelatin, gelatin derivatives, albumin, casein, and the like, cellulose derivatives such as methyl cellulose, carboxymethyl cellulose, and the like, sugar derivatives such as sodium alginate, starches (including modified starches), and the like, gum arabic, polyvinyl alcohol, hydrolysate of styrene/maleic acid copolymer, carboxy-modified polyvinyl alcohol, polyacrylamide, saponified compounds of a vinyl acetate/polyacrylate copolymer, and synthetic high polymers of sugar polystyrene sulfonate. Among these, gelatin and polyvinyl alcohol are desirable.

As the electron donating colorless dye related to the recording material of the present invention, various compounds including conventionally known compounds such as triphenylmethane phthalide type compounds, fluoran type compounds, phenothiazine type compounds, indolyl phthalide type compounds, leucoauramine type compounds, rhodamine lactam type compounds, triphenylmethane type compounds, triazene type compounds, spiropyran type compounds, fluorene type compounds, and the like can be used. Specific examples of the phthalides are described in the specifications of U.S. Pat. No. 23,024 (reissued), U.S. Pat. Nos. 3,491,111, 3,491,112, 3,491,116, and 3,509,174, and the like. Specific examples of the fluorans are described in the specifications of U.S. Pat. Nos. 3,624,107, 3,627,787, 3,641,011, 3,462,828, 3,681,390, 3,920,510, and 3,959,571, and the like. Specific examples of spirodipyrans are described in the specification of U.S. Pat. No. 3,971,808 and the like. Specific examples of pyridine type and pyrazine type compounds are described in the specifications of U.S. Pat. Nos. 3,775,424, 3,853,869, and 4,246,318, and the like. Specific examples of the fluorene type compounds are described in the specification of Japanese Patent Application No. 61-240989 and the like.

Briefly, these compounds are illustrated by examples of triarylmethane type compounds such as 3,3-bis(p-dimethylaminophenyl)-6-dimethylaminophthalide, 3,3-bis(p-dimethylaminophenyl)phthalide, 3-(p-dimethylaminophenyl)-3-(1,3-dimethylindole-3-yl) phthalide, 3-(p-dimethylaminophenyl)-3-(2-methylindole-3-yl)phthalide, and the like. Examples of diphenylmethane type compounds may be 4,4'-bis-dimethylaminobenzhydrinbenzyl ether, N-halophenyl-leucoauramine, N-2,4,5-trichlorophenylleucoauramine, and the like. Examples of xanthene type compounds may be rhodamine-B-anilinolactam, rhodamine-(p-nitrino)lactam, 2-(dibenzylamino)fluoran, 2-anilino-3-methyl-6-diethylaminofluoran, 2-anilino-3-methyl-6-dibutylaminofluoran, 2-anilino-3-methyl-6-N-ethyl-N-isoamylaminofluoran, 2-anilino-3-methyl-6-N-methyl-N-cyclohexylaminofluoran, 2-anilino-3-chloro-6-diethylaminofluoran, 2-anilino-3-methyl-6-N-ethyl-N-isobutylaminofluoran, 2-anilino-6-dibutylaminofluoran, 2-anilino-3-methyl-6-N-methyl-N-tetrahydrofurfurylaminofluoran, 2-anilino-3-methyl-6-piperidinoaminofluoran, 2-(o-chloroanilino)-6-diethylaminofluoran, 2-(3,4-dichloroanilino)-6-diethylaminofluoran, and the like. Examples of thiazine type compounds may be benzoylleucomethylene blue, p-nitrobenzylleucomethylene blue, and the like. Examples of spiro-type compounds are 3-methyl-spiro-dinaphthopyran, 3-ethyl-spiro-dinaphthopyran, 3,3'-dichloro-spiro-dinaphthopyran, 3-benzylspiro-dinaphthopyran, 3-methyl-naphtho-(3-methoxy-benzo) spiropyran, 3-propyl-spiro-dibenzopyran, and the like. When being applied to full color recording material particularly, the electron donating colorless dyes for cyan, magenta, and yellow may be selected with reference to U.S. Pat. No. 4,800,149 and the like, for yellow to U.S. Pat. No. 4,800,148 and the like, and for cyan to JP-A No. 63-53542 and the like.

The electron donating colorless dye used for the recording material of the present invention can be microencapsulated using conventional methods known to persons skilled in the art. These microencapsulation methods include methods described in; U.S. Pat. Nos. 2,800,457 and 2,800,458 in which the coacervation of a hydrophilic wall forming material is utilized; U.S. Pat. No. 3,287,154, BP No.990443, and JP-B Nos. 38-19574, 42-446, and 42-771 in which interfacial polymerization is utilized; U.S. Pat. Nos. 3,418,250 and 3,660,304 in which the crystallization of a polymer is utilized; U.S. Pat. No. 3,796,669 in which an isocyanate polyol wall material is used; U.S. Pat. No. 3,914,511 in which an isocyanate wall material is used; U.S. Pat. Nos. 4,001,140, 4,087,376, and 4,089,802 in which a urea/formaldehyde type or a urea formaldehyde/resorcinol type wall forming material is used; and U.S. Pat. No. 4,025,455 in which a wall material such as a melamine/formaldehyde resin, hydroxypropyl cellulose, or the like is used. Also, other than the above methods, an in-situ method using monomer polymerization which is described in JP-B No. 36-9168 and JP-A No. 51-9079; an electrophoretic dispersion and cooling method described in BP Nos. 952807 and 965074; a spray drying method described in U.S. Pat. No. 3,111,407 and BP No. 930422 or the like can be utilized. Though the microencapsulation method in the present invention is not limited to these methods, it is desirable to form a high polymer film as a micro-capsule wall after emulsifying a core material.

Explaining a method of producing a microcapsule wall for the recording material of the present invention, the microencapsulation which makes use especially of polymerization of a reactant from an oil droplet is very efficient. This microencapsulation method ensures that a desirable capsule for a recording material, which has a uniform particle diameter and is excellent in storing stability, is produced in a short period of time. For example, in the case of using polyurethane as a material for a capsule wall, polyvalent isocyanate and a second material (for example, polyol or polyamine) which is to react with polyvalent isocyanate as required to form a capsule wall are mixed in an oily liquid to be microencapsulated, emulsion-dispersed in water, and then the temperature is raised to cause a high polymer formation reaction on the interface of the oil droplet to take place and thereby to form a capsule wall. At this time, an auxiliary solvent having a low boiling point and high solubility may be added in the oily liquid. In the above process, the compounds disclosed in U.S. Pat. Nos. 3,281,383, 3,773,695, and 3,793,268, JP-B Nos. 48-40347 and 49-24159 and JP-A Nos. 48-80191 and 48-84086 can be used as polyvalent isocyanate and polyol or polyamine to be reacted with polyvalent isocyanate.

Given as examples of polyvalent isocyanate are diisocyanates such as m-phenylene diisocyanate, p-phenylene diisocyanate, 2,6-tolylene diisocyanate, 2,4-tolylene diisocyanate, naphthalene-1,4-diisocyanate, diphenylmethane-4,4-diisocyanate, 3,3'-dimethoxy-4,4'-biphenyl-diisocyanate, 3,3'-dimethyldiphenylmethane-4,4'-diisocyanate, xylilene-1,4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene-1,2-diisocyanate, cyclohexylene-1,4-diisocyanate, and the like; triisocyanates such as 4,4',4"-triphenylmethane triisocyanate, and toluene-2,4,6-triisocyanate; tetraisocyanates such as 4,4'-dimethyldiphenylmethane-2,2', 5,5'-tetraisocyanate; isocyanate prepolymers such as a trimethylolpropane adduct of hexamethylene diisocyanate, trimethylolpropane adduct of 2,4-tolylene diisocyanate, trimethylolpropane adduct of xylylene diisocyanate, and hexanetriol adduct of tolylene diisocyanate.

As examples of polyol, aliphatic or aromatic polyvalent alcohol, hydroxypolyester, and hydroxypolyalkylene ether are given. The following polyols described in JP-A No. 60-49991 are used: Specifically, examples of polyols may include ethylene glycol, 1,3-propanediol, 1,4-butanediol, 1,5-pentanediol, 1,6-hexanediol, 1,7-heptanediol, 1,8-octanediol, propylene glycol, 2,3-dihydroxybutane, 1,2-dihydroxybutane, 1,3-dihydroxybutane, 2,2-dimethyl-1,3-propanediol, 2,4-pentanediol, 2,5-hexanediol, 3-methyl-1,5-pentanediol, 1,4-cyclohexanedimethanol, dihydroxycyclohexane, diethylene glycol, 1,2,6-trihydroxyhexane, 2-phenylpropylene glycol, 1,1,1-trimethylolpropane, hexanetriol, pentaerythritol, pentaerythritol ethyleneoxide adduct, glycerol ethyleneoxide adduct, glycerol, 1,4-di(2-hydroxyethoxy)benzene, condensates of aromatic polyvalent alcohol such as resorcinol dihydroxyethyl ether or the like and alkylene oxide, p-xylylene glycol, m-xylylene glycol, α,α'-dihydroxy-p-diisopropylbenzene, 4,4'-dihydroxy-diphenylmethane, 2-(p,p'-dihydroxydiphenylmethyl)benzyl alcohol, ethylene oxide adduct of bisphenol A, propylene oxide adduct of bisphenol A, and the like. Polyol is used so that the proportion of a hydroxide group thereof is preferably from 0.02 to 2 mols per mol of an isocyanate group.

Given as examples of polyamine are ethylenediamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hydroxytrimethylenediamine, diethylenetriamine, triethylenetriamine, triethylenetetramine, diethylaminopropylamine, tetraethylenepentamine, amine adduct of an epoxy compound and the like. Polyvalent isocyanate can be reacted with water to form a high polymer material.

The water-soluble polymer which can be used in the step of producing a microcapsule may be any of a water-soluble anionic high polymer, nonionic high polymer, and amphoteric polymer. As the anionic high polymer, either a natural or a synthetic high polymer may be used and, for example, those having a —COO— group, —$SO_2$— group, or the like are exemplified. Specific examples of the anionic natural polymers are gum arabic, alginic acid, pectin, and the like. Specific examples of anionic semi-synthetic high polymers are carboxymethyl cellulose, gelatin derivatives such as gelatin phthalate, starch sulfate, cellulose sulfate, lignosulfonic acid, and the like. Also, specific examples of anionic synthetic high polymers are maleic anhydride type (including hydrolyzed compounds) copolymers, acrylic acid type (including methacrylic acid types) polymers and copolymers, vinylbenzenesulfonic acid type polymers and copolymers, carboxy modified polyvinyl alcohol, and the like. Examples of the nonionic polymer may include polyvinyl alcohol, hydroxyethyl cellulose, methyl cellulose, and the like. Also, gelatin and the like exemplify the amphoteric compound. Among these, gelatin, gelatin derivatives, or polyvinyl alcohol is preferred. Each of these water-soluble polymers is used as an aqueous solution with a concentration of from 0.01 to 10% by weight. The average particle diameter of the capsules used for the recording material of the present invention is 20 $\mu$m or less and preferably 5 $\mu$m or less in view especially of the resolution. Also, if the particle diameter is too small, the surface area of a fixed amount of a solid is so large that a large amount of wall material is required. Therefore, the particle diameter is preferably 0.1 $\mu$m or more.

The electron donating colorless dye concerning the recording material of the present invention may be present in the microcapsule either as a solution or as a solid. When the electron donating colorless dye is allowed to exist in a capsule as a solution, capsulation may take place with the election donating colorless dye dissolved in a solvent. At this time, the amount of the solvent is preferably 1 to 500 parts by weight to 100 parts by weight of the electron donating colorless dye. The solvent used in this capsulation step may be the same as that used in the emulsification of the above photocurable composition. Also, a volatile solvent can be used together with the other solvent as an auxiliary solvent for dissolving the electron donating colorless dye in this capsulation step. Examples of such a volatile solvent include ethyl acetate, propyl acetate, isopropyl acetate, butyl acetate, methylene chloride, and the like.

In the recording material of the present invention, it is preferable to add a matting agent to the protective layer. Given as examples of the matting agent are inorganic compounds such as silica, magnesium oxide, barium sulfate, strontium sulfate, silver halide, and the like; particles of polymers such as polymethyl methacrylate, polyacrylonitrile, and polystyrene; and particles of starches such as carboxy starch, corn starch, carboxynitrophenyl starch, and the like which have preferably a particle diameter of from 1 to 2 $\mu$m. Among these matting agents, polymethyl methacrylate particles and silica particles are particularly preferable. Preferable silica particles are, for example, Sailoid AL-1, 65, 72, 79, 74, 404, 620, 308, 978, 161, 162, 244, 255, 266, 150, and the like which are manufactured by FUJI-DEVISON CHEMICAL LTD. The amount of the matting agent is from 2 to 500 mg/m$^2$ and preferably from 5 to 100 mg/m$^2$.

A curing agent is also added to each layer such as the light and heat sensitive layer, intermediate layer, protective layer, and the like of the recording material of the present invention. It is especially preferable to add the curing agent to the protective layer to reduce stickiness. A useful curing agent is the so-called "gelatin curing agent" which is used for manufacturing a photographic sensitive material. Examples of the curing agent include aldehyde type compounds such as formaldehyde, glutaraldehyde, and the like; compounds having a reactive halogen atom, which are described in U.S. Pat. No. 3,635,718 and the like; compounds having a reactive and ethylenically unsaturated bond, which are described in U.S. Pat. No. 3,635,718 and the like; aziridine compounds described in U.S. Pat. No. 3,017,280 and the like; epoxy type compounds described in U.S. Pat. No. 3,091,537 and the like; halogenocarboxyaldehydes such as mucochloric acid; dioxanes such as dihydoxydioxane, dichlorodioxane, and the like; vinylsulfones described in U.S. Pat. Nos. 3,642,486 and 3,687,707; vinylsulfone precursors described in U.S. Pat. No. 3,841,872; and ketovinyls described in U.S. Pat. No. 3,640,720. Also, inorganic curing agents such as chrome alum, zirconium sulfate, boric acid, maybe used. Among these curing agents, particularly preferable compounds are 1,3,5-triacroyl-hexahydro-s-triazine, 1,2-bisvinylsulfonylmethane, 1,3-bis(vinylsulfonylmethyl)propanol-2, bis($\alpha$-vinylsulfonylacetoamide)ethane, 2,4-dichloro-6-hydroxy-s-triazine.sodium salt, 2,4,6-triethylenimino-s-triazine, boric acid and the like. The amount of the curing agent is preferably from 0.5 to 5% by weight of the amount of a binder.

Other than the above, colloidal silica may be added to the protective layer to decrease stickiness. As colloidal silica, for example, Snowtex 20, Snowtex 30, Snowtex C, Snowtex O, and Snowtex N, which are manufactured by Nissan Chemicals Industries Ltd. and the like are preferable. The amount of colloidal silica is preferably from 5 to 80% by weight of the amount of binder. Also, a fluorescent whitening agent for improving the whiteness of the recording material of the present invention and a bluing agent in the form of a blue dye may be added to the protective layer.

A multicolor recording material using the recording material of the present invention may have a multilayer structure in which each layer contains a photocurable composition capable of being sensitized by light of wave lengths and an electron donating colorless dye contained in microcapsules which forms different hues. Also, an intermediate layer containing a filter coloring material may be interposed between light and heat sensitive layers. The intermediate layer is composed mainly of a binder and a filter coloring material. Additives such as a curing agent, polymer latex, and the like may be added to the intermediate layer according to requirements.

The filter coloring material used for the recording material of the present invention is emulsion-dispersed by an oil-in-water dispersion method or a polymer dispersion method whereby it can be added to a desired layer, especially to the intermediate layer. In the oil-in-water dispersion method, the coloring material is dissolved in any one or both of an organic solvent, for example, with a high-boiling point of 175° C. or more and an auxiliary solvent, for example, with a boiling point of from 30° C. to 160° C. and is then finely dispersed in an aqueous medium such as water, an aqueous gelatin solution, or an aqueous polyvinyl alcohol solution in the presence of a surfactant. Examples of the high-boiling point organic solvent are described in U.S. Pat. No. 2,322,027 and the like. As the high-boiling point organic solvent and the auxiliary solvent, the same solvents as those used in the capsulation step can be preferably used. Also, the dispersion may be associated with phase inversion. Further, after the auxiliary solvent is removed or reduced as required by distillation, nudel washing, or ultrafiltration, the solvent containing the coloring material may be applied.

A latex dispersion process and specific examples of curing and impregnating latex are described in U.S. Pat. No. 4,199,383, German Patent Application Laid-Open (OLS) Nos. 2,541,274 and 2,541,230, JP-A Nos. 49-74538, 51-59943, and 54-32552, Research Disclosure, Vol. 148, August, 1976, Item 14850, and the like. As compounds suitable for the latex, for example, a copolymer latex of acrylate or methacrylate (for example, ethyl acrylate, n-butyl acrylate, n-butyl methacrylate, 2-acetoacetoxyethyl methacrylate, or the like) and acid monomer (for example, acrylic acid, 2-acrylamide-2-methylpropanesulfonic acid, or the like) is preferable.

As the binder for each of the layers including the protective layer, light and heat sensitive layer, and intermediate layer of the recording material of the present invention, other than aqueous high polymers which can be used for the emulsion-dispersion of the photocurable composition or for the capsulation of the electron donating colorless dye, solvent soluble high polymers including polystyrene, polyvinylformal, polyvinylbutyral, acrylic resins (for example, polymethyl acrylate, polybutyl acrylate, polymethyl methacrylate, polybutyl methacrylate, and copolymers of these), phenol resins, styrene/butadiene resins, ethyl cellulose, epoxy resins, urethane resins, and the like, and a high polymer latex of these can be used. Among these, gelatin and polyvinyl alcohol are desirable.

Various surfactants may be used for each layer of the light and heat sensitive recording material of the present invention for the purposes of application aid, antistatic, improvement in slipping, emulsion-dispersion, prevention of adhesion, and the like. Examples of the surfactants include non-ionic surfactants such as saponin, and polyethylene oxide derivatives such as polyethylene oxide, alkyl ether of polyethylene oxide, and the like; anionic surfactants such as alkyl sulfonate, alkylbenzene sulfonate, alkylnaphthalene sulfonate, alkyl sulfate, N-acyl-N-alkyltaurines, sulfosuccinate, sulfoalkylpolyoxyethylenalkyl phenyl ether, and the like; amphoteric surfactants such as alkylbetaines, alkylsulfobetaines, and the like; and cationic surfactants such as aliphatic groups, aromatic quaternary ammonium salts, and the like, which may be used as required.

Various additives including the aforementioned additives may be added to the recording material of the present invention as required. These additives include, for example, a dye agent for preventing irradiation and halation, UV ray absorber, plasticizer, fluorescent whiting agent, matting agent, application auxiliary, curing agent, antistatic agent, slip improving agent, and the like. Typical examples of these additives are described in Research Disclosure, Vol. 176, December, 1978, Item 17643 and Research Disclosure, Vol. 187, November, 1979, Item 18716.

The light and heat sensitive applying solution used for the recording material of the present invention and the solution for each layer are dissolved in a solvent, applied to a desired support member, and dried to prepare the recording material of the present invention. Examples of the solvents used in this case include water and alcohol such as methanol, ethanol, n-propanol, isopropanol, n-butanol, sec-butanol, methyl cellosolve, and 1-methoxy-2-propanol; halogen type solvents such as methylene chloride and ethylene chloride; ketones such as acetone, cyclohexanone, and methyl ethyl ketone; esters such as methyl acetate cellosolve, ethyl acetate, and methyl acetate; toluene, and xylene, and the like. These solvents may be used either singly or in combinations of two or more. Among these, water is particularly preferable.

The applying solution for each layer is applied to a support member using a blade coater, rod coater, knife coater, roll doctor coater, reverse roll coater, transfer roll coater, gravure coater, kiss roll coater, curtain coater, extrusion coater, or the like. The method for application may be selected with reference to Research Disclosure, Vol. 200, December, 1980, Item 20036, Term XV. An appropriate thickness of the recording layer is from 0.1 $\mu$m to 50 $\mu$m.

The recording material of the present invention can be applied in various fields, for example, a copier, fax, printer, label, color proof, second master drawing, and the like.

Given as examples of materials as the support member suitable for the recording material of the present invention are paper, coated paper, laminated paper, synthetic paper, and the like; films such as apolyethylene terephthalate film, cellulose triacetate film, polyethylene film, polystyrene film, polycarbonate film, and the like; plates of metals such as aluminum, zinc, copper, and the like; and materials prepared by processing the surfaces of these support members by various treatments including surface treatment, under coat, metal deposition, and the like. Also, the support member may be selected with reference to the support materials described in Research Disclosure, Vol. 200, December, 1980, Item 20036, Term XVII. In addition, an anti-halation layer may be arranged on the surface of the support member and a slipping layer, antistatic layer, curing preventive layer, adhesive layer, and the like may be arranged on the back face of the support member according to the object.

The recording to the recording material of the present invention can be carried out using near infrared light of wave lengths ranging from 0.7 to 3 $\mu$m. For emitting this near infrared light, a conventionally known power source such as a semiconductor laser emitting diode, xenon lamp, or the like may be used as required. The multicolor recording as above-mentioned can be performed by using two or more kinds of near infrared coloring materials and by irradiating from the power sources with lights of two or more wave lengths.

The recording material of the present invention is subjected to heat-developing treatment at the same time or after the above-mentioned image exposing step. As a method for heating in this heat-developing treatment, a variety of conventionally known methods may be used. The heating temperature is generally from 80° C. to 200° C. and preferably 85° C. to 130° C. The period of time for heating is one second to five minutes and preferably from three seconds to one minute. It is preferable to expose entirely the recording material to cure optically the uncured portion after the heat developing treatment. The entire exposure ensures that the developing reaction of the background surface and the color extinction reaction of a color emitting portion are both restrained so that the storing stability of an image is improved.

It is preferable to include a step of uniformly preheating the entire recording material at a prescribed temperature lower than the color developing temperature in the same manner as in the above-described recording step whereby the improvement in sensitivity is observed.

The recording material of the present invention is applicable not only to the above described recording methods but also to conventionally known recording methods. For example, this recording material can be applied to the method using the silver halide light and heat sensitive recording material, which is proposed by 3M Co. (Minnesota Mining and Manufacturing Co.) in International Application WO 95/31754 in which laser beams are applied at a prescribed overlap to improve the heat sensitivity, contrast, and image quality.

Specifically, this method is based on a technology for irradiating laser beams to form a latent image, comprising (1) supplying laser beams by a radiative power source capable of forming a light spot with of at least one of the height and length being 600 $\mu$m or less on the target position; (2) supplying a recording material, which can be sensitized by the beams from the power source, to the target position; (3) first, irradiating the recording material according to an image distribution with the beams from a radiative power source capable of forming a beam spot with of at least one of the length and width being 250 $\mu$m or less; and (4) irradiating the recording material according to the image distribution with beams so that at least some beam spots formed by the secondary irradiated beams are overlapped with the beam spot first irradiated of the recording material and exposing the recording material to light to form a latent image, wherein (1) the recording material is exposed to light capable of sensitizing the recording material and (2) beams are applied to a plurality of light spots having a small area with in one direction being 600 $\mu$m or less on the recording material in a manner that at least 10% of the small area is overlapped with one of other small areas, which means that at least 10% of the total energy supplied to at least one of the small area is overlapped.

Also, the recording method proposed by Canon Inc. in (JP-A) No. 60-195568 may be utilized for the recording material of the present invention. Specifically, in this method, laser beams are applied to the surface of the recording material at an angle inclined to a vertical axes perpendicular to the surface of the recording material so that the reflecting pitch at which the incident beams reflect on a thin layer of the recording material is allowed to be larger than the diameter of the beam spot to prevent light interference which appears in the recording material. Application of this technology to the recording material of the present invention ensures the provision of an image of higher quality.

EXAMPLES

The present invention will be explained in more detail by way of examples, which do not limit the present invention. In these examples, all designations of parts and % indicate parts by weight and % by weight respectively unless otherwise described.

1. (Preparation of Capsule for Electron Donating Colorless Dye)

1-a. Preparation of Capsule for Electron Donating Colorless Dy (1)

8.9 g of an electron donating colorless dye (1) was dissolved in 16.9 g of ethyl acetate, to which were added 20 g of a Takenate D-110N (manufactured by Takeda Chemicals Industries Ltd.) and 2 g of a Milionate MR200 (manufactured by Nippon Polyurethane Industries Ltd.). This solution was added to a mixed solution of 42 g of 8% gelatin phthalate and 1.4 g of 10% sodium dodecylbenzene sulfonate solution, followed by homogenizing at 20° C. to prepare an emulsion. 14 g of water and 72 g of 2.9% aqueous tetraethylenepentamine solution were added to the emulsion. The mixture was heated to 60° C. while agitating for two hours to prepare a capsule with an average diameter of 0.5 μm, which contained the electron donating colorless dye (1) in the core.

2. (Preparation of Emulsion of Photocurable Composition)

2-a. Preparation of Emulsion of Photocurable Composition (1)

5 g of a polymerizable electron acceptable compound (1) was added to a mixed solution of 0.13 g of a photoinitiator (1), 0.1 g of a spectral sensitization coloring material (1), and 3 g of isopropyl acetate (solubility in water: about 4.3%). This solution was added to a mixed solution of 13 g of an aqueous 13% gelatin solution, 0.8 g of an aqueous 2% surfactant (1) solution, and 0.8 g of an aqueous 2% surfactant (2) solution and the mixture was homogenized using a homogenizer (manufactured by Nippon Seiki Co., Ltd.) at 10,000 rpm for 5 minutes to prepare an emulsion of a photocurable composition (1).

2-b. Preparation of Emulsion of Photocurable Composition (2)

An emulsion of a photocurable composition (2) was prepared in the same manner as in preparative example 2-a except that 0.1 g of a spectral sensitization coloring material (2) was used instead of 0.1 g of the spectral sensitization coloring material (1).

2-c. Preparation of Emulsion of Photocurable Composition (3)

An emulsion of a photocurable composition (3) was prepared in the same manner as in preparative example 2-a except that 0.1 g of a spectral sensitization coloring material (3) was used instead of 0.1 g of the spectral sensitization coloring material (1).

2-d. Preparation of Emulsion of Photocurable Composition (4)

An emulsion of a photocurable composition (4) was prepared in the same manner as in preparative example 2-a except that 0.13 g of a photoinitiator (2) was used instead of 0.13 g of the photoinitiator (1).

2-e. Preparation of Emulsion of Photocurable Composition (5)

10 g of (1-methyl-2-phenoxy)ethyl resorcylate, which was an electron acceptable compound, and 8 g of trimethylolpropane triacrylate monomer were added to a mixture of 0.2 g of a photoinitiator (1), 0.2 g of a spectral sensitization coloring material (1), and 4 g of an ethyl acetate solution containing 0.2 g of N-phenylglycineethylester as an adjuvant for promoting polymerization. This solution was added to a mixed solution of 19.2 g of an aqueous 15% gelatin solution, 4.8 g of water, 0.8 g of an aqueous 2% surfactant (1) solution, and 0.8 g of an aqueous 2% surfactant (2) solution and the mixture was homogenized using a homogenizer (manufactured by Nippon Seiki Co., Ltd.) at 10,000 rpm for 5 minutes to prepare an emulsion of a photocurable composition (5).

The chemical formulae of the above polymerizable electron acceptable compound (1) and compounds used for preparing the above emulsion and the like are shown below:

Electron donating colorless dye (1)

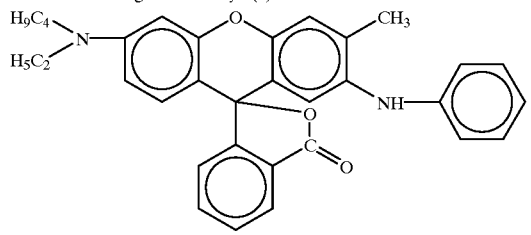

Photoinitiator (1)

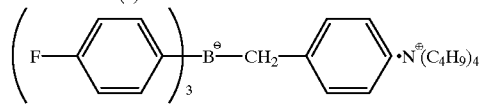

Photoinitiator (2)

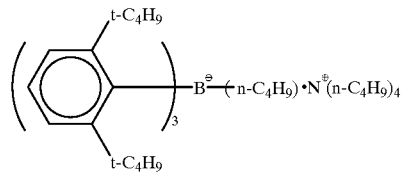

-continued

Spectral sensitization coloring material (1)

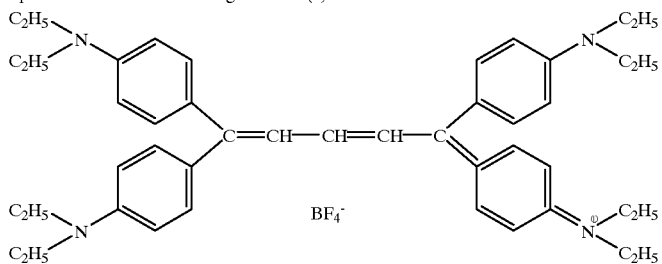

Spectral sensitization coloring material (2)

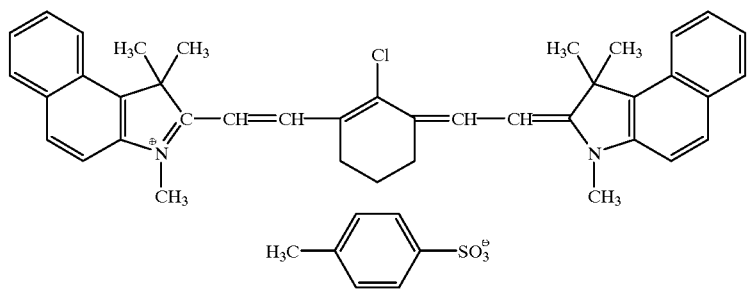

Spectral sensitization coloring material (3)

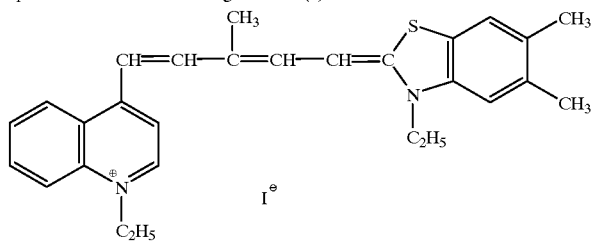

Polymerizable electron donating acceptable compound (1)

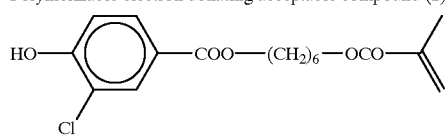

3. (Preparation of Application Solution for Light and Heat Sensitive Layer)

3-a. Preparation of Application Solution for Light and Heat Sensitive Layer (1)

4 g of the capsule containing electron donating colorless dye (1), 12 g of the emulsion of photocurable composition (1), and 12 g of an aqueous 15% gelatin solution were mixed to prepare an application solution for a light and heat sensitive layer (1).

3-b. Preparation of Application Solution for Light and Heat Sensitive Layer (2)

4 g of the capsule containing electron donating colorless dye (1), 12 g of the emulsion of photocurable composition (2), and 12 g of an aqueous 15% gelatin solution were mixed to prepare an application solution for a light and heat sensitive layer (2).

3-c. Preparation of Application Solution for Light and Heat Sensitive Layer (3)

4 g of the capsule containing electron donating colorless dye (1), 12 g of the emulsion of photocurable composition (3), and 12 g of an aqueous 15% gelatin solution were mixed to prepare an application solution for a light and heat sensitive layer (3).

3-d. Preparation of Application Solution for Light and Heat Sensitive Layer (4)

4 g of the capsule containing electron donating colorless dye (1), 12 g of the emulsion of photocurable composition (4), and 12 g of an aqueous 15% gelatin solution were mixed to prepare an application solution for a light and heat sensitive layer (4).

3-e. Preparation of Application Solution for Light and Heat Sensitive Layer (5)

1 g of the capsule containing electron donating colorless dye (1) and 10 g of the emulsion of photocurable composition (5) were mixed to prepare an application solution for a light and heat sensitive layer (5).

4. (Preparation of Application Solution for Protective Layer)

4-a. Preparation of Application Solution for Protective Layer (1)

4.5 g of an aqueous 10% gelatin solution, 4.5 g of distilled water, 0.5 g of an aqueous 2% surfactant (3) solution, 0.3 g of an aqueous 2% surfactant (4) solution, 0.5 g of an aqueous 2% hardening agent (1), Sailoid 72 (manufactured by FUJI-DEVISON CHEMICAL LTD.) in such an amount that the applied amount was 50 mg/m$^2$, and 1 g of Snowtex N were mixed to prepare an application solution for a protective layer (1). The chemical formulae of the surfactants (1) to (4) are shown in the following:

Surfactant (1)

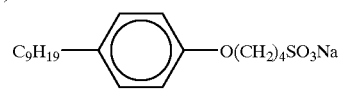

Surfactant (2)

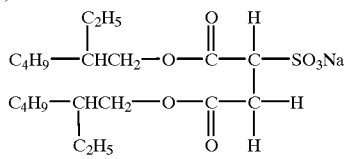

Surfactant (3)

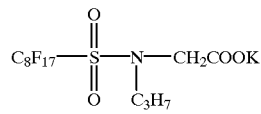

Surfactant (4)

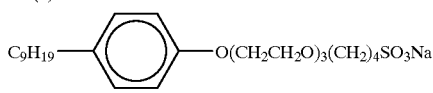

5. (Support Member)

A support member was formed from transparent polyester with a thickness of 75 μm.

Example 1

The application solution (1) for the light and heat sensitive layer was applied to the support member using a coating bar in a manner that the dry weight of the applied layer was 10 g/m² and dried at 30° C. for 10 minutes. Next, the application solution for the protective layer (1) was applied to the surface of the light and heat sensitive layer using a coating bar in a manner that the dry weight of the applied layer was 2 g/m² and dried at 30° C. for 10 minutes to obtain a sample of Example 1.

Example 2

A sample of Example 2 was prepared in the same manner as in Example 1 except that the application solution (2) of the light and heat sensitive layer was used instead of the application solution (1).

Example 3

A sample of Example 3 was prepared in the same manner as in Example 1 except that the application solution (3) of the light and heat sensitive layer was used instead of the application solution (1).

Example 4

A sample of Example 4 was prepared in the same manner as in Example 1 except that the application solution (4) of the light and heat sensitive layer was used instead of the application solution (1).

Example 5

A sample of Example 5 was prepared in the same manner as in Example 1 except that the application solution (5) of the light and heat sensitive layer was used instead of the application solution (1).

Example 6

A sample of Example 6 was prepared in the same manner as in Example 1 except that 0.23 g of the compound described below was used instead of 0.13 g of the photoinitiator (1) and 0.1 g of the spectral sensitization coloring material (1), which were contained in the emulsion of the photocurable composition (1).

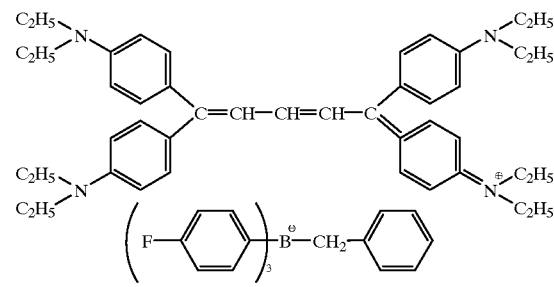

Example 7

A sample of Example 7 was prepared in the same manner as in Example 2 except that 0.23 g of the compound described below was used instead of 0.13 g of the photoinitiator (1) and 0.1 g of the spectral sensitization coloring material (2), which were contained in the emulsion of the photocurable composition (2).

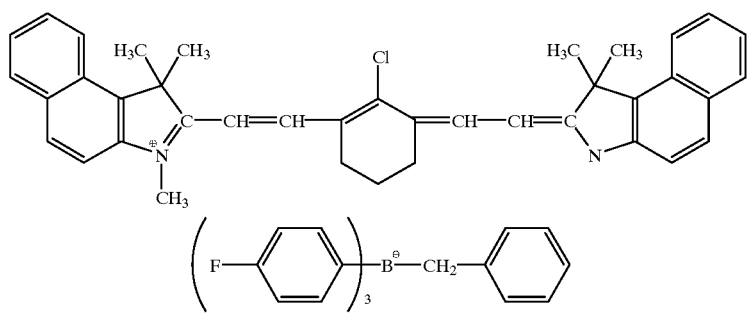

Example 8

A sample of Example 8 was prepared in the same manner as in Example 3 except that 0.23 g of the compound described below was used instead of 0.13 g of the photoinitiator (1) and 0.1 g of the spectral sensitization coloring material (3), which were contained in the emulsion of the photocurable composition (3).

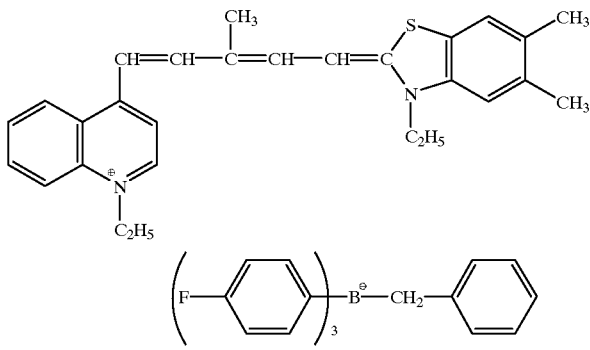

Comparative Example 1

A sample of Comparative Example 1 was prepared in the same manner as in Example 1 except that the photoinitiator (1) (organic borate compound) was eliminated from the photocurable composition (1) of the application solution (1) for the light and heat sensitive layer.

Semiconductor laser light of a wave length of 830 nm was irradiated on each of the prepared light and heat sensitive recording materials from the side of the heat sensitive layer in a manner that scanning speed was altered to vary irradiation energy step-wedgewise and so that the maximum energy on the surface of the heat sensitive layer was 50 mJ/cm$^2$ to carry out exposure.

Each of the recording materials, on which a latent image was formed in this manner, was heated using a heat plate heated to 120° C. for 5 seconds. As a result, a step wedge image was observed on each of the recording materials. The sensitivity was evaluated by the energy at which the back ground surface appeared in the edge images formed at a fixed irradiation dose. The color developing density and the fogging on the back ground were measured using a Macbeth transmitting type densitometer. The transparency of the recording material was evaluated with a haze meter (DIGITAL HAZE COMPUTER HGM-2DP, manufactured by Suga Test Meter Co., Ltd.). The results are shown in Table 1.

TABLE 1

|  | Sensitivity (mJ/cm$^2$) | Dmax | Fog on the background | Haze value (%) |
|---|---|---|---|---|
| Example 1 | 8 | 2.7 | 0.12 | 10 |
| Example 2 | 11 | 2.6 | 0.12 | 11 |
| Example 3 | 13 | 2.7 | 0.12 | 10 |
| Example 4 | 15 | 2.6 | 0.12 | 10 |
| Example 5 | 26 (Negative) | 2.6 | 0.10 | 9 |
| Example 6 | 8 | 2.7 | 0.12 | 10 |
| Example 7 | 11 | 2.6 | 0.12 | 11 |
| Example 8 | 13 | 2.7 | 0.12 | 10 |
| Comparative Example 1 | No image formation | — | — | — |

Table 1 shows that the light and heat sensitive recording materials of the present invention were all excellent in sensitivity and developing density and were reduced in background fogging. Also, an image of high contrast was formed by using these materials. Further, these materials were superior in transparency. On the other hand, the sample of Comparative Example 1 which does not include excluding organic borate was incapable of forming an image.

Example 9

A sample of Example 9 was prepared in the same manner as in Example 6 except that the compound II-(11) exemplified as the organic borate for the cationic coloring material represented by the above formula II-(2) was used instead of the photoinitiator (1) contained in the photocurable composition (1) of the application solution (1) for the light and heat sensitive layer and 0.05 g of the compound represented by the structural formula described below was added as an adjuvant for promoting the sensitivity.

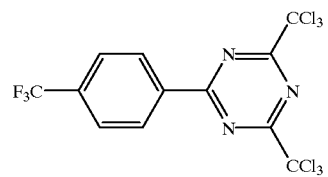

Example 10

A sample of Example 10 was prepared in the same manner as in Example 9 except that the compound II-(12) exemplified as the organic borate for the cationic coloring material was used instead of the compound II-(11).

Example 11

A sample of Example 11 was prepared in the same manner as in Example 9 except that the compound II-(13) exemplified as the organic borate for the cationic coloring material was used instead of the compound II-(11).

Example 12

A sample of Example 12 was prepared in the same manner as in Example 9 except that 0.05 g of the compound represented by the structural formula described below was added as an adjuvant for promoting the sensitivity instead of the compound used as the adjuvant in Example 9.

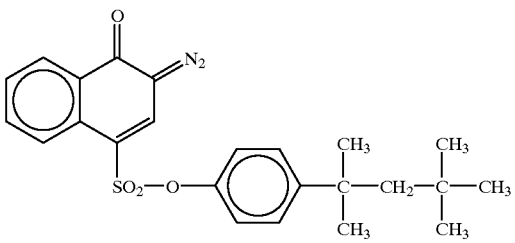

Example 13

A sample of Example 13 was prepared in the same manner as in Example 12 except that the compound II-(12) exemplified as the organic borate for the cationic coloring material was used instead of the compound II-(11).

Example 14

A sample of Example 14 was prepared in the same manner as in Example 12 except that the compound II-(24) exemplified as the organic borate for the cationic coloring material was used instead of the compound II-(11).

Comparative Example 2

A sample of Comparative Example 2 was prepared in the same manner as in Example 9 except that the compound II-(11) exemplified as the organic borate for the cationic coloring material represented by the above general formula (II), which was contained in the emulsion of photocurable composition (1) in the application solution (1) for the light and heat sensitive layer was replaced with the compound represented by the formula described below, which was the same as the compound II-(11) except for the organic borate portion exchanged with the inorganic borate.

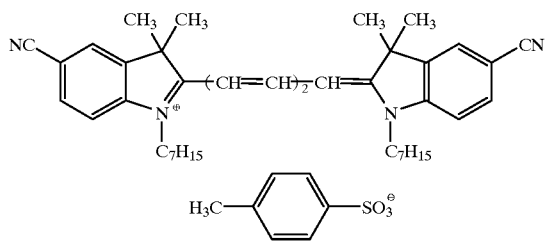

Semiconductor laser light of a wave length of 670 nm was irradiated on each of the light and heat sensitive recording materials, which were prepared in Examples 9 to 14 and Comparative Example 2, from the side of the light and heat sensitive layer in a manner that scanning speed was altered to vary irradiation energy step-wedgewise and that the maximum energy on the surface of the heat sensitive layer was 50 mJ/cm² to carry out exposure.

Other characteristics were evaluated in the same manner as in the evaluation of the samples obtained in Examples 1 to 8. The results are shown in Table 2.

TABLE 2

|  | Sensitivity (mJ/cm²) | Dmax | Fog on the background | Haze value (%) |
| --- | --- | --- | --- | --- |
| Example 9 | 0.8 | 2.7 | 0.13 | 10 |
| Example 10 | 0.7 | 2.7 | 0.13 | 11 |
| Example 11 | 0.9 | 2.6 | 0.13 | 10 |
| Example 12 | 0.7 | 2.7 | 0.12 | 10 |
| Example 13 | 0.8 | 2.7 | 0.13 | 11 |
| Example 14 | 0.4 | 2.8 | 0.13 | 10 |
| Comparative Example 2 | No image formation | — | — | — |

Table 2 shows that the light and heat sensitive recording materials of the present invention were all excellent in coloring density and had reduced background fogging. Also, an image of high contrast was formed by using these materials. Further, these materials were superior in transparency. It was also confirmed that the samples prepared in Examples 9 to 14, to which the adjuvant for promoting the sensitivity was added, exhibited particularly excellent sensitivity. On the other hand, the sample of Comparative Example 2, in which the non-borate compound having a similar structure was used, was incapable of forming an image.

What is claimed is that:

1. A light and heat sensitive recording material comprising a light and heat sensitive recording layer disposed on a support member, wherein said light and heat sensitive recording layer includes an electron donating colorless dye contained in heat-responsive microcapsules; a compound containing an electron accepting portion and a polymerizable vinyl monomer portion in the same molecule, and an organic borate which are arranged outside the heat responsive microcapsules, wherein said organic borate compound is a compound represented by the following formula (I)

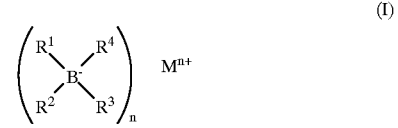

wherein M represents a cation selected from the group consisting of an alkali metal atom, quaternary ammonium, pyridinium, quinolium, diazonium, morpholinium, tetrazolium, acridinium, phosphonium, sulfonium, oxosulfonium, sulfur, oxygen, carbon, halogenium, Cu, Ag, Hg, Pd, Fe, Co, Sn, Mo, Cr, Ni, As, and Se;

n denotes an integer of from 1 to 6; and $R^1$, $R^2$, $R^3$, and $R^4$ respectively represent a group selected from the group consisting of a substituted or unsubstituted alkyl group, a substituted or unsubstituted alkenyl group, a substituted or unsubstituted alkynyl group, an alicyclic group, a substituted or unsubstituted aryl group, a substituted or unsubstituted alkaryl group, a substituted or unsubstituted aryloxyl group, a substituted or unsubstituted aralkyl group, a substituted or unsubstituted heterocyclic group, and a substituted or unsubstituted silyl group, wherein $R^1$, $R^2$, $R^3$ and $R^4$, may be the same or different and two or more of $R^1$, $R^2$, $R^3$ and $R^4$ may be combined to form a cyclic structure;

wherein said light and heat sensitive layer includes a coloring material selected from the group consisting of a methine coloring material, a polymethine coloring material, a triarylmethane coloring material, an indoline coloring material, an azine coloring material, a xanthene coloring material, an oxazine coloring material, an acridine coloring material, and a styryl coloring material, which exhibits maximum light absorption in the 500 to 1100 nm range, as a spectral sensitization coloring material outside said heat-responsive microcapsules.

2. A light and heat sensitive recording material according to claim 1, wherein said coloring material, which exhibits maximum light absorption in the 500 to 1100 nm range, is a coloring material selected from a group consisting of a cyanine coloring material, a hemicyanine coloring material, a rhodamine coloring material, and an azamethine coloring material.

3. A light and heat sensitive recording material comprising a light and heat sensitive recording layer disposed on a support member, wherein said light and heat sensitive recording layer includes an electron donating colorless dye contained in heat-responsive microcapsules; and an electron accepting color developer, a polymerizable vinyl monomer, and an organic borate which are arranged outside the heat responsive microcapsules, wherein said organic borate compound is a compound represented by the following formula (I)

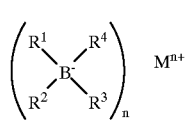

(I)

wherein M represents a cation selected from the group consisting of an alkali metal atom, quaternary ammonium, pyridinium, quinolium, diazonium, morpholinium, tetrazolium, acridinium, phosphonium, sulfonium, oxosulfonium, sulfur, oxygen, carbon, halogenium, Cu, Ag, Hg, Pd, Fe, Co, Sn, Mo, Cr, Ni, As, and Se;

n denotes an integer of from 1 to 6; and $R^1$, $R^2$, $R^3$, and $R^4$ respectively represent a group selected from the group consisting of a substituted or unsubstituted alkyl group, a substituted or unsubstituted alkenyl group, a substituted or unsubstituted alkynyl group, an alicyclic group, a substituted or unsubstituted aryl group, a substituted or unsubstituted alkaryl group, a substituted or unsubstituted aryloxyl group, a substituted or unsubstituted aralkyl group, a substituted or unsubstituted heterocyclic group, and a substituted or unsubstituted silyl group, wherein $R^1$, $R^2$, $R^3$ and $R^4$ may be the same or different and two or more of $R^1$, $R^2$, $R^3$ and $R^4$ may be combined to form a cyclic structure;

wherein said light and heat sensitive layer includes a coloring material selected from a group consisting of a methine coloring material, a polymethine coloring material, a triarylmethane coloring material, an indoline coloring material, an azine coloring material, a xanthene coloring material, an oxazine coloring material, an acridine coloring material, and a styryl coloring material, which exhibits maximum light absorption in the 500 to 1100 nm range, as a spectral sensitization coloring material outside said heat-responsive microcapsules.

4. A light and heat sensitive recording material according to claim 3, wherein said coloring material, which exhibits maximum light absorption in the 500 to 1100 nm range, is a coloring material selected from a group consisting of a cyanine coloring material, a hemicyanine coloring material, a rhodamine coloring material, and an azamethine coloring material.

5. A light and heat sensitive recording material comprising a light and heat sensitive recording layer disposed on a support member, wherein said light and heat sensitive recording layer includes an electron donating colorless dye contained in heat-responsive microcapsules, a compound containing an electron accepting portion and a polymerizable vinyl monomer portion in the same molecule, and an organic borate which are arranged outside the heat responsive microcapsules, wherein said organic borate compound is an organic borate of a cationic coloring material.

6. A light and heat sensitive recording material according to claim 5, wherein said organic borate of a cationic coloring material is a compound represented by the following general formula (II):

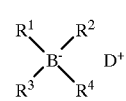

II wherein $D^+$ represents a cationic coloring material and $R^1$, $R^2$, $R^3$, and $R^4$ respectively represent a group selected from the group consisting of a substituted or unsubstituted alkyl group, a substituted or unsubstituted alkenyl group, a substituted or unsubstituted alkynyl group, alicyclic group, a substituted or unsubstituted aryl group, a substituted or unsubstituted alkaryl group, a substituted or unsubstituted aryloxyl group, a substituted or unsubstituted aralkyl group, a substituted or unsubstituted heterocyclic group, and a substituted or unsubstituted silyl group, wherein $R^1$, $R^2$, $R^3$, and $R^4$, which may be the same or different and two or more of $R^1$, $R^2$, $R^3$, and $R^4$ may be combined to form a cyclic structure.

7. A light and heat sensitive recording material according to claim 6, wherein said cationic coloring material is a coloring material selected from a group consisting of a cationic methine coloring material, a cationic polymethine coloring material, a cationic triarylmethane coloring material, a cationic indoline coloring material, a cationic azine coloring material, a cationic xanthene coloring material, a cationic oxazine coloring material, a cationic acridine coloring material, and a cationic styryl coloring material.

8. A light and heat sensitive recording material according to claim 6, wherein said cationic coloring material is a coloring material selected from a group consisting of a cationic cyanine coloring material, a cationic hemicyanine coloring material, a cationic rhodamine coloring material, and a cationic azamethine coloring material.

9. A light and heat sensitive recording material comprising a light and heat sensitive recording layer disposed on a support member, wherein said light and heat sensitive recording layer includes an electron donating colorless dye contained in heat-responsive microcapsules; and an electron accepting color developer, a polymerizable vinyl monomer, and an organic borate which are arranged outside the heat responsive microcapsules, wherein said organic borate compound is an organic borate of a cationic coloring material.

10. A light and heat sensitive recording material according to claim 9, wherein said organic borate of a cationic coloring material is a compound represented by the following general formula (II):

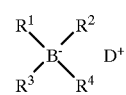

II wherein $D^+$ represents a cationic coloring material and $R^1$, $R^2$, $R^3$, and $R^4$ respectively represent a group selected from the group consisting of a substituted or unsubstituted alkyl group, a substituted or unsubstituted alkenyl group, a substituted or unsubstituted alkynyl group, alicyclic group, a substituted or unsubstituted aryl group, a substituted or unsubstituted alkaryl group, a substituted or unsubstituted aryloxyl group, a substituted or unsubstituted aralkyl group, a substituted or unsubstituted heterocyclic group, and a substituted or unsubstituted silyl group, wherein $R^1$, $R^2$, $R^3$, and $R^4$, which may be the same or different and two or more of $R^1$, $R^2$, $R^3$, and $R^4$ may be combined to form a cyclic structure.

11. A light and heat sensitive recording material according to claim 10, wherein said cationic coloring material is a coloring material selected from a group consisting of a cationic methine coloring material, a cationic polymethine coloring material, a cationic triarylmethane coloring material, a cationic indoline coloring material, a cationic azine coloring material, a cationic xanthene coloring material, a cationic oxazine coloring material, a cationic acridine coloring material, and a cationic styryl coloring material.

12. A light and heat sensitive recording material according to claim 10, wherein said cationic coloring material is a coloring material selected from a group consisting of a cationic cyanine coloring material, a cationic hemicyanine coloring material, a cationic rhodamine coloring material, and a cationic azamethine coloring material.

* * * * *